United States Patent [19]

Kamohara et al.

[11] Patent Number: 5,742,071
[45] Date of Patent: Apr. 21, 1998

[54] WIRINGLESS LOGICAL OPERATION CIRCUITS

[75] Inventors: Shiroo Kamohara, Berkeley, Calif.; Peter M. Lee; Hitoshi Matsuo, both of Kokubunji, Japan; Sigeo Ihara, Tokorozawa, Japan

[73] Assignee: Hitachi, Ltd., Tokyo, Japan

[21] Appl. No.: 695,533

[22] Filed: Aug. 12, 1996

Related U.S. Application Data

[63] Continuation-in-part of Ser. No. 394,767, Feb. 27, 1993, abandoned, which is a continuation-in-part of Ser. No. 117,801, Sep. 8, 1993, Pat. No. 5,422,496, which is a continuation of Ser. No. 961,547, Oct. 15, 1992, Pat. No. 5,258,625.

[30] Foreign Application Priority Data

| Oct. 15, 1991 | [JP] | Japan | 3-265940 |
| Feb. 25, 1994 | [JP] | Japan | 6-027710 |
| Aug. 26, 1994 | [JP] | Japan | 6-201763 |

[51] Int. Cl.$^6$ .............. H01L 29/06; H01L 31/0328; H01L 31/0336
[52] U.S. Cl. ................ 257/17; 257/22; 257/25; 257/29
[58] Field of Search ............... 257/17, 25, 29, 257/22

[56] References Cited

U.S. PATENT DOCUMENTS

| 4,829,343 | 5/1989 | Levi | 257/26 |
| 4,843,447 | 6/1989 | Harris et al. | 257/17 X |
| 4,926,221 | 5/1990 | Levi | 257/26 |
| 5,258,625 | 11/1993 | Kamohara et al. | 257/14 |
| 5,350,930 | 9/1994 | Schmid et al. | 257/14 |
| 5,422,496 | 6/1995 | Kamohara et al. | 257/24 |

FOREIGN PATENT DOCUMENTS

| 58-172086 | 10/1983 | Japan |
| 59-65783 | 4/1994 | Japan |
| 7762044 | 6/1995 | Japan |
| 7234776 | 9/1995 | Japan |

OTHER PUBLICATIONS

Likharev, "Single–Electron Transistors: Electrostatic Analogs of the DC Squids", *IEEE Transactions on Magnetics*, vol. 23, No. 2, Mar. 1987, pp. 1142–1145.

Ralls et al., "Discrete Resistance Switching in Submicrometer Silicon Inversion Layers: Individual Interface Traps and Low–Frequency (1/f3) Noise", *Physical Review Letters*, vol. 52, No. 3, 16 Jan. 1984, pp. 228–231.

No Author, "Quantum Effect Integrated Circuit in Accordance with New Concept," *Business & Technology*, The Nikkan Kogyo Shinbun Ltd., Apr. 8, 1994.

(List continued on next page.)

*Primary Examiner*—William Mintel
*Attorney, Agent, or Firm*—Antonelli, Terry, Stout, & Kraus, LLP

[57] ABSTRACT

A logical operation circuit in which wiring as generally performed between transistors is made unnecessary to improve reliability, stability and integration degree of a logical circuit using a tunnel phenomenon, for example, a single-electron tunnel phenomenon, or a flight phenomenon of a particle group. Conducting materials are arranged in a two-dimensional plane or three-dimensional space in the logical circuit. When two conducting materials are arranged to be nearest each other, the two conducting materials are connected, for example, by a single-electron tunnel phenomenon. When two conducting materials are arranged to be not nearest, there is no connection between the conducting materials by the tunnel phenomenon. Propagation of electrons is controlled by changing the arrangement. Further, because particles which have entered input regions move toward different flight directions respectively from a branch region on the basis of the property that two particles cannot enter simultaneously within an effective scatter distance by repulsive interaction between particles, flight of particles is controlled so as to enter or not branched particles into an observation region to thereby construct a wiringless logical operation circuit.

21 Claims, 40 Drawing Sheets

OTHER PUBLICATIONS

Takeda, "Reliability and Device Structure in Submicron MOS Devices," *Tech. Reports of IECIE*, SDM90–119, Nov. 1990, pp. 1–8.

No Author, "*LSI*", *Journal of Physics of Japan*, vol. 46, No. 5, 1991, pp. 352–359.

Likharev, "Single–Electron Transistors: Electrostatic Analogs of the DCS Squids", *IEEE Transactions on Magnetics*, vol. MAG–23, No. 2, Mar. 1987, pp. 1142–1145.

Landauer, "Can We Switch By Control of Quantum Mechanical Transmission?", *Physics today*, Oct. 1989, pp. 119–121.

Takeda, "Reliability and Device Structure in Submicron MOS Devices", *Tech. Reports of IECIE*, SDM90–119, Nov. 1990, pp. 1–8.

"LSI", *Journal of Physics of Japan*, vol. 46, No. 5, 1991, pp. 352–359.

| INPUT | | OUTPUT |
|---|---|---|
| p | q | o |
| 1 | 1 | 1 |
| 1 | 0 | 1 |
| 0 | 1 | 1 |
| 0 | 0 | 0 |

NOT

| INPUT | OUTPUT |
|---|---|
| p | o |
| 1 | 0 |
| 0 | 1 |

NOT

| 103 | | 108 |
|---|---|---|
| INPUT | | OUTPUT |
| p | q | o |
| 1 | 1 | 1 |
| 1 | 0 | 1 |
| 0 | 1 | 1 |
| 0 | 0 | 0 |

| 103 | 108 |
|---|---|
| INPUT | OUTPUT |
| p | o |
| 1 | 0 |
| 0 | 1 |

| 103 | 108 | |
|---|---|---|
| INPUT | OUTPUT | |
| p | o1 | o2 |
| 1 | 1 | 1 |
| 0 | 0 | 0 |

NOT

NOR

| INPUT | | OUTPUT |
|---|---|---|
| p | q | o |
| 1 | 1 | 0 |
| 1 | 0 | 0 |
| 0 | 1 | 0 |
| 0 | 0 | 1 |

| OR | 6103 | 6108 |
|---|---|---|
| INPUT | | OUTPUT |
| p | q | o |
| 1 | 1 | 1 |
| 1 | 0 | 1 |
| 0 | 1 | 1 |
| 0 | 0 | 0 |

| NOT 6103 | 6108 |
|---|---|
| INPUT | OUTPUT |
| p | o |
| 1 | 0 |
| 0 | 1 |

| EOR | 6103 | | 6108 |
|---|---|---|---|
| | INPUT | | OUTPUT |
| | p | q | o |
| | 1 | 1 | 0 |
| | 1 | 0 | 1 |
| | 0 | 1 | 1 |
| | 0 | 0 | 0 |

FANOUT

| INPUT | OUTPUT | |
|---|---|---|
| p | o1 | o2 |
| 1 | 1 | 1 |
| 0 | 0 | 0 |

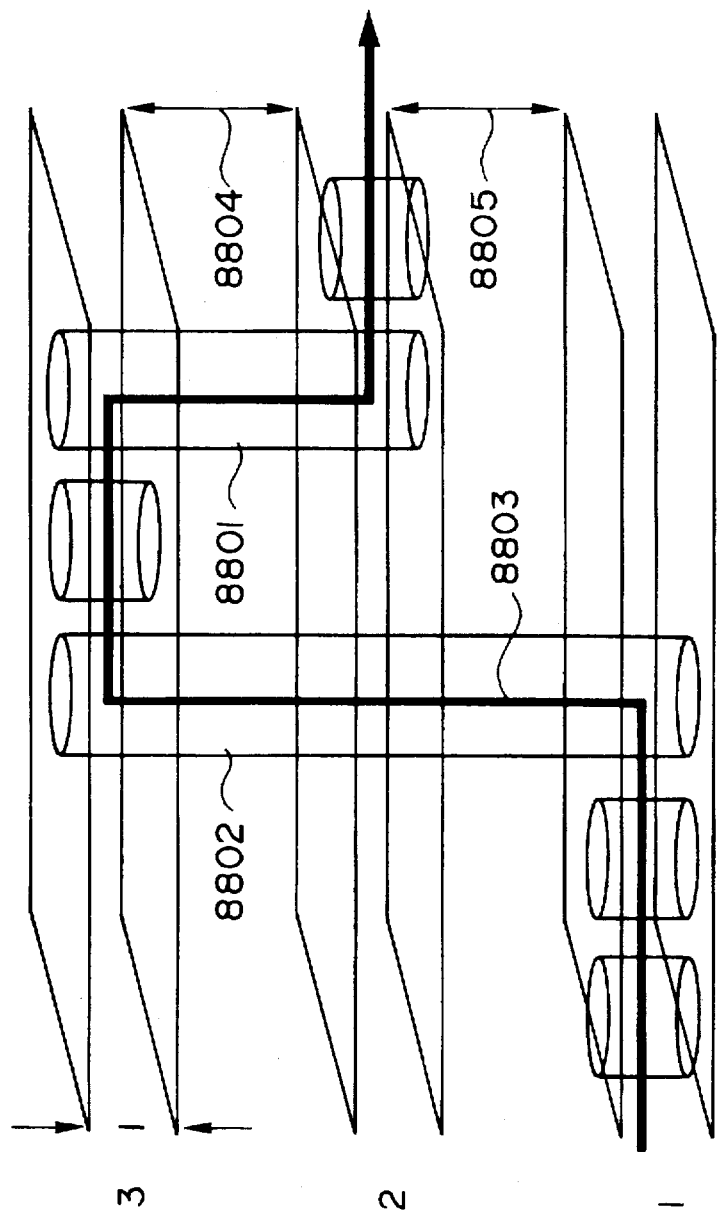

WIRINGLESS LOGICAL OPERATION CIRCUITS

This application is a Continuation-in-Part application of application Ser. No. 08/394,767, filed Feb. 27, 1995, now abandoned, which is a Continuation-in-Part application of application Ser. No. 08/117,801, filed Sept. 8, 1993, now U.S. Pat. No. 5,422,496, which is a Continuation application of application Ser. No. 07/961,547, filed Oct. 15, 1992, now U.S. Pat. No. 5,258,625, issued Nov. 2, 1993.

BACKGROUND OF THE INVENTION

The present invention relates to a logical operation circuit and particularly to a logical operation circuit in which a plurality of conducting materials combined by a single-electron tunnelling phenomena are arranged in predetermined positions so that conventional wiring between transistors becomes unnecessary. The conducting materials include metal, semimetal, semiconductor, superconducting materials, ionic conductor and super ionic conductor.

DESCRIPTION OF RELATED ART

Conventional VLSI integrating techniques will reach their limit caused by quantum effects when the channel size of an MOS device reaches the order of ¼ micron. Because a large part of the advance of integrated circuits is based on the uninterrupted progress of size reduction, the limit will become a large problem in the near future. In order to solve this problem, proposals for various kinds of elements using the quantum effects positively have been made eagerly. As one of those various kinds of elements using the quantum effects, there has been proposed a single-electron tunnel transistor using the grain property of electrons.

As described in IEEE TRANSACTIONS ON MAGNETICS, VOL. MAG-23 (1987), pp 1142–1145, the single-electron tunnel transistor contains an electrostatic capacitance constituted by a small capacitor of the order of femto-farad as a basic constituent member. An insulating film used for the small capacitor is thinned so that electrons can tunnel through conducting materials. In such a small capacitor, a phenomenon in which the tunneling of electrons through conducting materials is prohibited in the temperature range of $T<e^2/(2Ck)$ and in the small capacitor potential difference range of $-e/(2C)<V<e/(2C)$ is called "Coulomb blockade". Here, T is a temperature, V is the potential difference across the opposite ends of the small capacitor, e is the quantity of electric charge of an electron, C is the electrostatic capacitance of the small capacitor, and k is Boltzmann's constant. When the potential difference across the small capacitor exceeds the condition of coulomb blockade, that is, when the coulomb blockade is released, tunneling of a single electron through conducting materials takes place. The single-electron tunnel transistor interprets the state of the coulomb blockade as a switching-off state and the state of releasing of the coulomb blockade as a switching-on state. The single-electron tunnel transistor is a three-terminal switching element which contains three small capacitor connected in order to control the aforementioned on/off state and allocated as three terminals called "gate", "source" and "drain", respectively.

According to the aforementioned condition, coulomb blockade can be provided at a higher temperature and at a higher capacitor voltage when the electrostatic capacitance of the small capacitor is reduced by reduction of the area of the capacitor. If the current fine machining technique is used, the single-electron tunnel transistor can operate at room temperature theoretically. Further, the single-electron tunnel transistor is large in the ratio of the conductance at the time of switching-on thereof to the conductance at the time of switching-off of the same compared with an electron-wave interference device which is a quantum effect device of the same type. Further, the device characteristic of the single-electron tunnel transistor is affected only a little by the small change of the structure thereof. Accordingly, the spotlight of attention is focused on the single-electron tunnel transistor as a main candidate for a next generation superfine device.

According to a press release from Toshiba (The Nikkan-Kogyo Shinbun Ltd., Apr. 8, 1994), there is a report of a kind of logical circuit using dipolemoments caused by single electron motions in a well or very limited regions arranged on a two-dimensional plane.

When a logical circuit is to be assembled by using switching devices having three or more terminals, a plurality of three-terminal switching devices (or switching devices having a larger number of terminals) are wired according to a desired logical structure. As a result, wiring becomes dense with the advance of size reduction of the devices, so that there is a possibility that wiring cannot be made practically. That is, the area required for wiring prevents integration of the IC chip though fine devices are used. Further, when the aforementioned single-electron tunnel transistors are used as ultimately size-reduced devices, there is a high possibility that the devices cannot operate normally because of the influence of a floating capacitance between the device and wiring. It is therefore necessary from both viewpoints of improvement of the degree of integration and reliability of devices that wiring is reduced as much as possible when a logical circuit is formed by using a single-electron tunnel phenomenon. It is therefore necessary to select a new logical circuit forming method different from the conventional method in which a logical circuit is formed on the basis of three-terminal switching devices.

For the formation of an arbitrary logical circuit by the new logical circuit forming method, it is necessary that an OR gate, a NOT gate, a FANOUT and a wire can be formed by the method. Any logic can be synthesized by use of only a combination of NOT operations and OR operations. Further, in order to synthesize a complex logical function, there is required a gate having a function of connecting one output to a plurality of inputs, that is, a FANOUT. Further, in order to synchronize signals inputted to a gate in a logical circuit, there is required a device called a "wire" for adjusting signal delay. From the above description, it is said that basic constituent units required for constituting a logical circuit are an OR gate, a NOT gate, a FANOUT and a wire. Accordingly, if there is a wiringless logical circuit forming method which can provide these basic constituent units, an arbitrary wiringless logical circuit can be formed.

In the case of Toshiba, devices are arranged in a two-dimensional space. Thus, delay time with respect to respective signals propagating through different transmission paths are different from each other. And high integration of an IC chip may be more difficult than in a three-dimensional case. Further, order parameters peculiar to a two-dimensional coulomb system do not change and there is a Kosterlits-Thouless transition in which susceptibility as first order differentiation of external force energy diverges. Accordingly, the resulting circuit is not stable. Further, in the case of Toshiba, movement of electrons is made through a dipole, so that a signal propagates by so-called flip-flop of state in a certain local position. Accordingly, the case of Toshiba does not use a phenomenon of transporting one electron.

SUMMARY OF THE INVENTION

An object of the present invention is to provide a logical operation circuit in which wiring as ordinarily required between transistors is made unnecessary in order to improve reliability, stability and integration degree of a logical circuit using, for example, a single-electron tunnel phenomenon, or the like.

Another object of the present invention is to provide a logical circuit in which a margin such as, for example, honeycomb lattice size, or the like, can be set to be wide and can be adapted to a phenomena of transporting multiple electrons and other classical particles than electron as well as the single-electron tunnel phenomenon.

A further object of the present invention is to provide a logical circuit which can be adapted to general transporting phenomena including the single-electron tunnel phenomenon in three dimensions and which can be adapted to any lattice outside the limit of a normal lattice which is practically hard to manufacture by way of trial.

Spherical or cylindrical conducting materials are arranged so that the respective centers of the conducting materials are made coincident with predetermined lattice points where device arrangement is performed. Two conducting materials within a certain distance are connected by scatter of particles or a single-electron tunnel phenomenon. When two conducting materials are arranged so as to be farther apart than the certain distance, there is no connection between the conducting materials caused by the tunnel phenomenon. By the connection caused by the flight of particles or caused by the single-electron tunneling, a signal, that is, particles or an electron can propagate between conducting materials without requiring any wiring.

Further, because the connection caused by the scatter of particles, the flight of particles or the single-electron tunneling phenomenon can be limited by the way of two-dimensional or three-dimensional arrangement of conducting materials, and propagation of particles or an electron can be controlled by changing the arrangement of conducting materials. Accordingly, when an excess state in which a particle or electron is placed in a conducting material is made to correspond to logic "1" and a normal state is made to correspond to logic "0", propagation of a particle or electron can be made to correspond to a process of a logical operation. That is, the case where a particle or electron introduced by giving negative electric potential to a predetermined signal-input conducting material can reach a signal-output conducting material finally is made to correspond to a result "1" of the logical operation, and the case where the particle or electron cannot reach the signal-output conducting material finally is made to correspond to a result "0" of the logical operation.

From the above description, a group of conducting materials arranged in predetermined positions operate as a logical circuit using an electron as a signal. The present invention is characterized in that an OR gate, a NOT gate, a FANOUT and a wire which are basic constituent units for constituting an arbitrary logical circuit can be generated by the group of conducting materials. Because the way of arrangement of conducting materials is determined by each of the basic constituent units, the way of arrangement of conducting materials for an arbitrary logical circuit is determined by expressing desired logic with use of OR gates, NOT gates, FANOUT and wire in combination. Further, the problem and limitation peculiar to the aforementioned two-dimensional coulomb system can be eliminated by extending the system to a three-dimensional system.

BRIEF DESCRIPTION OF THE DRAWINGS

FIG. 74 shows an example of a multilayer logical circuit according to the present invention.

DESCRIPTION OF THE PREFERRED EMBODIMENTS

Figures 1, 2:
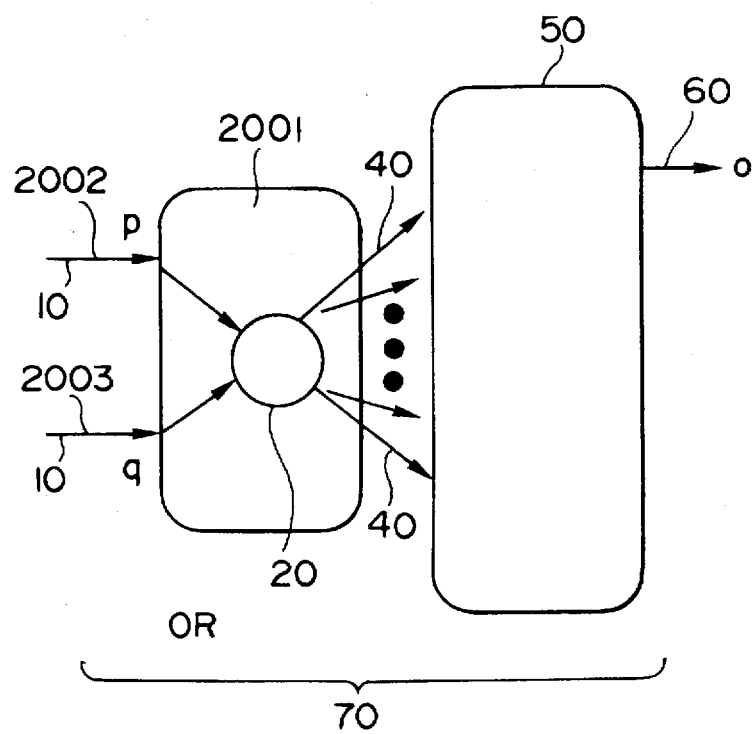
FIG. 1 shows an embodiment of an OR gate fromed according to the present invention.
FIG. 2 shows an embodiment of a logical operation by an OR gate.

FIG. 1 shows an embodiment of a wiringless logical circuit according to the present invention.

An embodiment of the structure of a circuit using particles in the case where quantum property is left out of consideration will be described below. For the understanding of the operation of the logical circuit shown in FIG. 1, description will be made first as for the classical physical phenomenon in the case where flight of one particle or flight of a particle group composed of some particles, such as diffusion, ballistic transport, quantum transportation, particle jump, is used.

In the present invention, a circuit element is composed of an input region, an interaction region, a branch region, an observation region and an output region. These regions are constituted by a plurality of devices. In FIG. 1, the reference numerals 2002 and 2003 designate input regions; 2001, (especially 20) an interaction region; 40, a branch region; 50, an observation region; and 60, an output region. In the drawing, black dots represent some paths.

In the case where electric potential capable of performing flight of one classical particle (an atom or an electron) such as diffusion, ballistic transport, etc. is applied, one classical particle introduced into an input region for inputting a signal flies toward the interaction region 20 less in energy level. In the case where the applied potential is, to the contrary, small, so that energy is increased by tunneling of one particle, the flight of particles is prohibited. The physical phenomenon in which the flight of particles is controlled by the direction and the magnitude of the applied electric potential as described above is called "particle flight control". As described above, particle flight is a physical phenomenon in which particles propagate toward a position less in energy level.

Concerning the background of such a single-atom flight phenomenon, interaction between particles plays an important role in the present invention. In the case where the applied electric potential condition is adjusted so that two particles enter into a device within one region, the applied electric potential condition for obtaining a high energy level can be realized easily. Generally, the two particles however cannot enter simultaneously within a certain distance (effective scattering length) because of the repulsion between the particles (for example, long distance coulomb potential or the like). Accordingly, the particles generally move to different flight directions in the branch region 40.

The number of flight directions and the number of flight paths in the branch region are not limited. When all flight directions and flight paths in the branch region are paths of input into the observation region, that is, when all particles from the branch region enter into the observation region, a particle is always outputted from the output region so long as particles enter into the input region. Accordingly, when the presence and absence of particles at terminals 2002 and 2003 in the input region are expressed as logic "1" and logic "0", respectively, as shown in FIG. 2, a particle is present at the output region except the case where particles are not present, neither at the terminal 2002, nor at the terminal 2003. Accordingly, the circuit element forms an OR gate.

On the other hand, in the case of a NOT circuit element, the arrangement of devices and networks is adjusted to prevent a particle given to the input region from going to the observation region from the branch region because of the interaction between the first-mentioned particle with another particle at the interaction region, that is, to prevent any particle from being outputted from the output region. The arrangement is adjusted on the other hand so that particles are present at the observation region, and a particle is outputted from the output region, when no particle is given to the input region. Not only the OR gate and the NOT gate but also a FANOUT and a wire can be formed based on the aforementioned flight of one particle (or one group of particles). It is generally known that any logical circuit can be composed theoretically so long as the OR gate, the NOT gate, the FANOUT and the wire can be formed.

An embodiment of the structure of a general circuit using single-electron tunnel junctions will be described below.

Also in the case of single-electron tunnel junctions, the logical circuit 70 shown in FIG. 1 functions as an OR gate as shown in FIG. 2. The structure of the logical circuit 70 in the case of single-electron tunnel junctions will be described below. Single-electron tunnel devices are placed in the aforementioned device positions. The configuration thereof is as follows. In the logical circuit 70, conducting materials are arranged so that the respective centers of the conducting materials in the regions 20, 40 and 50 in FIG. 1 are coincident with each other in accordance with arbitrary device positions. The vertices of the arrangement of the conducting materials vary according to desired logic. Two conducting materials are connected to each other by the single-electron tunnel phenomenon. In the case of another arrangement, there is no connection between conducting materials caused by the tunnel phenomenon. Because of the presence of connection caused by the single-electron tunnel phenomenon, a signal or a single electron can propagate through the conducting materials from the region 10 to the region 60 without the necessity of wiring. (This applies to the case of flight of an arbitrary particle so long as particle flight paths can be set.)

Further, the connection caused by the single-electron tunnel phenomenon is limited by the method of arrangement of conducting materials. Because the propagation of a single electron can be controlled by changing the arrangement of conducting materials, the circuit 70 can be formed as a circuit having a function of logical operation. The condition for connection between two conducting materials determines the lengths between arrangements and the radii of conducting materials. In the case where the single-electron tunnel phenomenon is utilized, the distance between conducting materials is about 230 Å when the radius of conducting materials is about 100 Å. In the case where diffusion of one classical atom is utilized, the distance between conducting materials is about 5 to 30 Å when the radius of conducting materials is about 5 to 10 Å. As other conducting materials having special functions than the conducting materials 20, 40 and 50 arranged in predetermined positions, there are a conducting material 10 for performing inputting for a logical operation and a conducting material 60 for outputting a result 50 of the logical operation. The conducting materials 20, 40 and 50 except those special conducting materials are used for performing the logical operation.

In FIG. 1, two conducting materials are used for performing inputting for a logical operation whereas one conducting material is used for outputting a result of the logical operation. That is, the logical circuit 70 is regarded as a two-input one-output logical operation gate.

Generally, the logical circuit 70 is a multi-input multi-output circuit. In the present invention, the excess and normal states of one particle or one electron in a conducting material are made to correspond to logic "1" and logic "0" respectively. The state in which an electron is introduced into a predetermined signal input conducting material 10 at a certain time interval by applying a negative electric potential to the conducting material 10 is expressed as an input state "1". The time interval for introduction of the electron is determined by the magnitude of the applied electric potential. Whether the introduced electron can propagate between the conducting material networks 20, 40 and 50 and finally can reach the signal output conducting material 60 or not, corresponds to a result "1" or "0" of the logical operation.

Figures 3, 4:
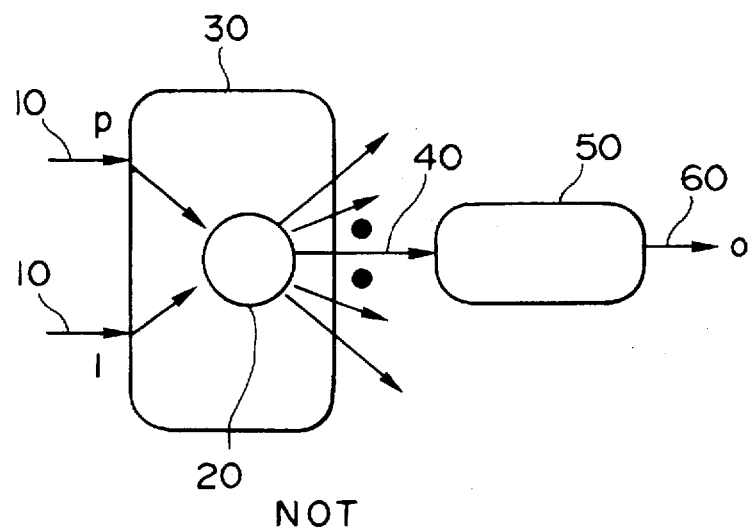
FIG. 3 shows an embodiment of a NOT gate formed according to the present invention.
FIG. 4 shows an embodiment of a logical operation by a NOT gate.
Figure 5:
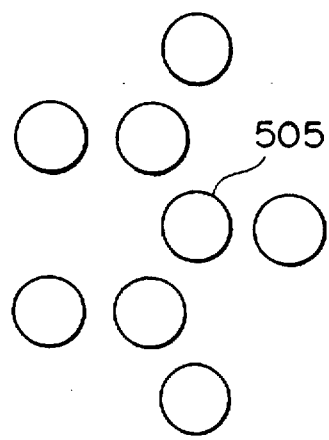
FIG. 5 is a plan view of a circuit network.
Figure 6:
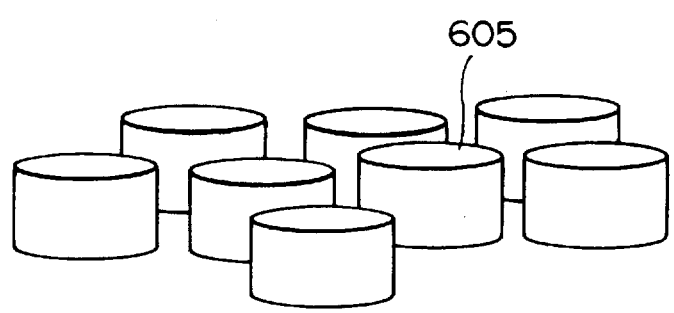
FIG. 6 is a bird's eye view of the circuit network.
Figure 10:
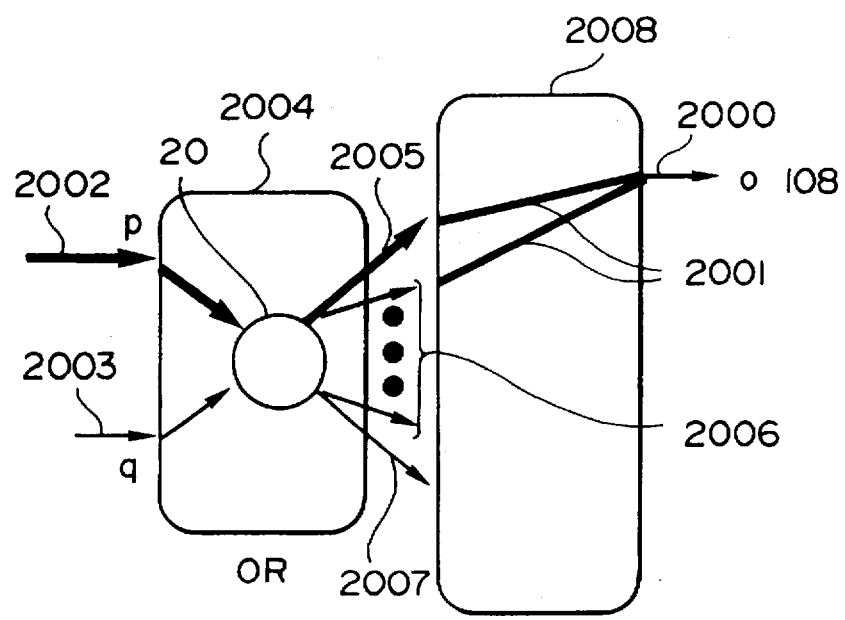
FIG. 10 is an explanatory view of signal propagation in the OR gate formed according to the present invention.

FIG. 2 shows output results 60 corresponding to predetermined input conditions 10 given to the logical circuit 70 shown in FIG. 1. FIG. 1 shows an embodiment of an OR gate according to the present invention. FIG. 3 shows a logical operation of a NOT gate, and FIG. 4 shows a truth value table for the logical operation. The OR gate shown in FIG. 1 outputs one result 60 of an arithmetic operation in response to two inputs 10. The operation of a circuit in which conducting materials are arranged as shown in FIG. 5 or 6 to perform an arithmetic operation shown in FIG. 2 will be described below in detail with reference to FIGS. 10, 11 and 12. As shown in FIG. 10, when the input signals 2002 and 2003 are "1" and "0", respectively, particles take the propagation path 2001 indicated by the thick solid line. Accordingly, the output signal 2000 is "1".

Figure 11:
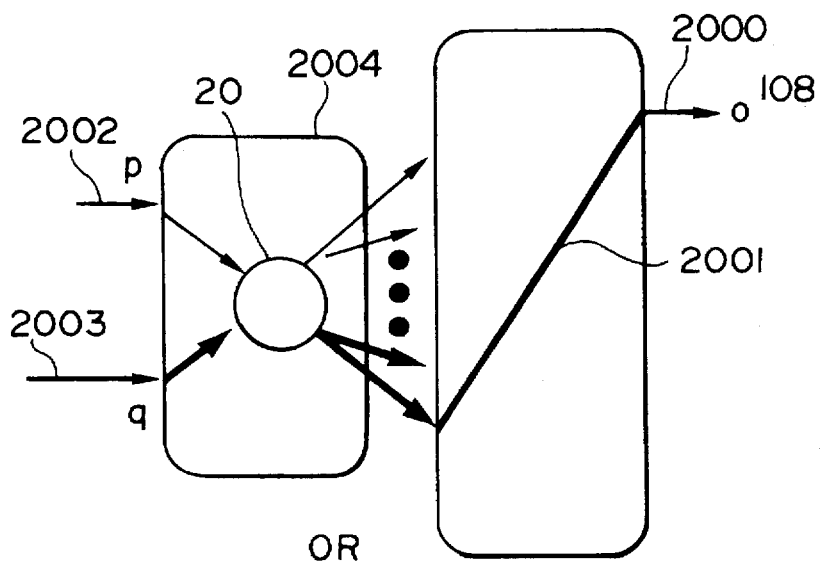
FIG. 11 is another explanatory view of signal propagation in the OR gate formed according to the present invention.
Figure 12:
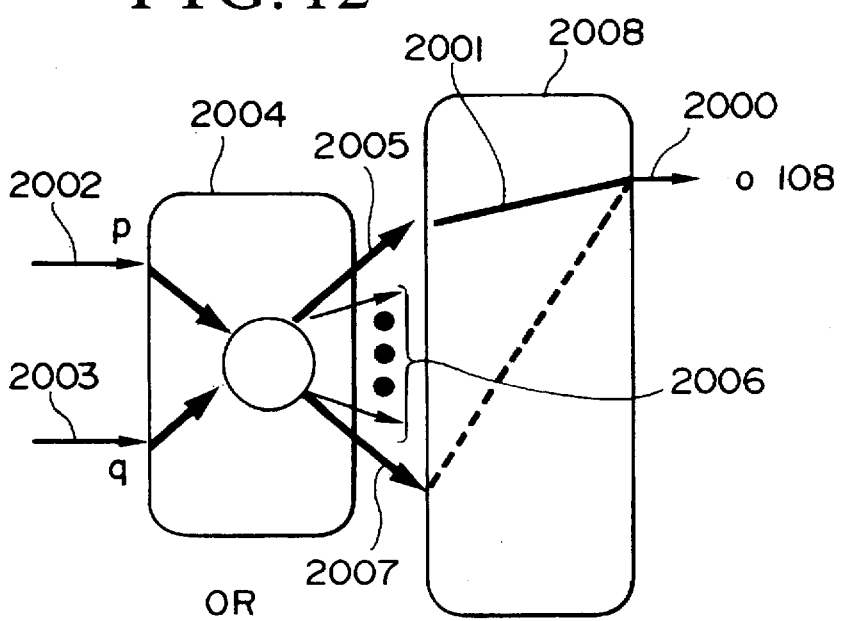
FIG. 12 is a further explanatory view of signal propagation in the OR gate formed according to the present invention.

As shown in FIG. 11, when the input signals 2002 and 2003 are "0" and "1", respectively, particles take the propagation path 2001 indicated by the thick solid line. Accordingly, the output signal 2000 is "1". As shown in FIG. 12, when the input signals 2002 and 2003 are "1" and "1", respectively, particles take the propagation path 2001 indicated by the thick solid line. In the propagation path 2005, particles incident to an effective repulsive force range from the input terminals 2002 and 2003 make a kind of collision caused by the interaction between the particles. Accordingly, the particles take the path 2005 or 2007 when the two particles go out of the portion 2004, so that the particles do not pass through the path 2006. As a result, the particles take the predetermined arbitrary path in the portion 2008. Accordingly, the output signal 2000 is "1". The portion 2008 may be formed to have at least one path through which either one of the particles out of the paths 2005 and 2006 passes to the portion 2000. This may be provided as shown in arrangement and structure which will be described later. Assuming now that the input signals 2002 and 2003 are "0" and "0", respectively, then there is no particle propagation. Accordingly, the output signal 2000 is "0". It is apparent from the above description that the arrangement shown in FIG. 1 forms an OR gate.

Figure 14:
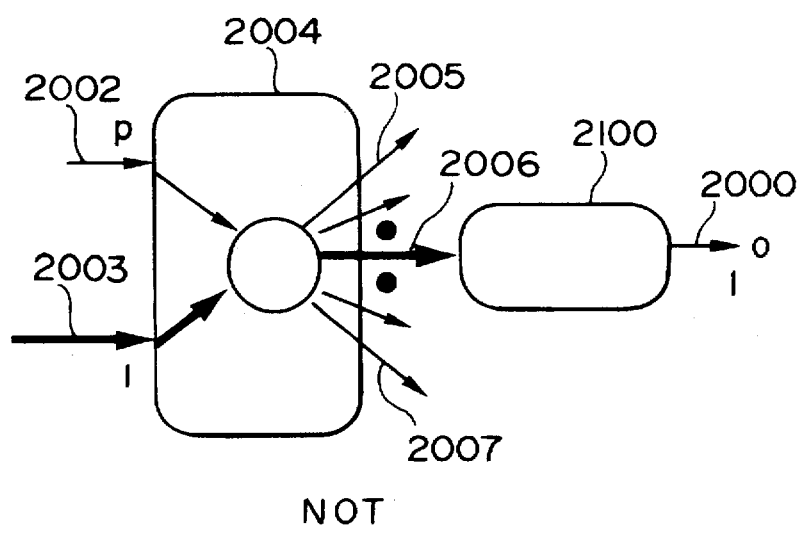
FIG. 14 is an explanatory view of signal propagation in the NOT gate formed according to the present invention.
Figure 15:
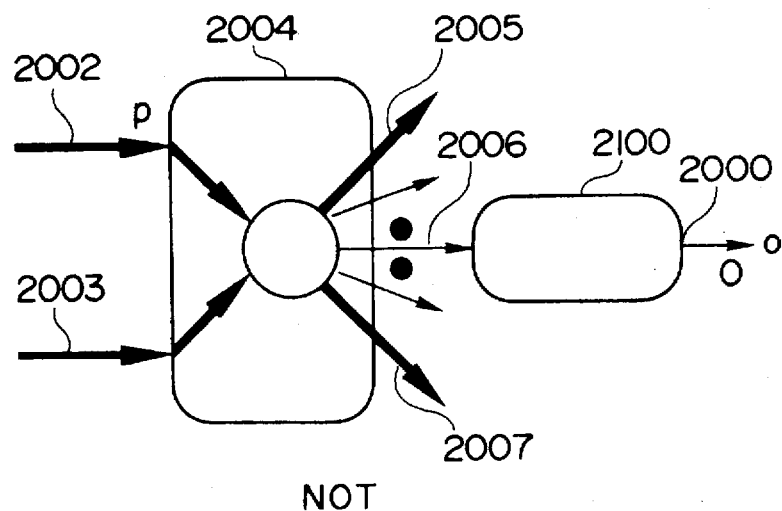
FIG. 15 is another explanatory view of signal propagation in the NOT gate formed according to the present invention.

FIG. 3 shows details of the operation of the circuit as an embodiment of a NOT gate according to the present invention. FIG. 4 shows results of a logical operation in the NOT gate. The NOT gate shown in FIG. 3 outputs one result 60 of an arithmetic operation in response to one input 10. The NOT gate is however different from the OR gate in that a signal having a constant value "1" is given as a constant input 2003 in the NOT gate. The reason why the arrangement of conducting materials shown in FIG. 3 gives an arithmetic operation shown in FIG. 4 will be described below with reference to FIGS. 14 and 15. As shown in FIG. 14, when the input signal 2002 is "0", the constant input 2003 is used singly so that particles take the propagation path 2006 indicated by the thick solid line. Accordingly, the output signal 2000 is "1". As shown in FIG. 15, when the input signal 2003 is "1", particles pass through the propagation path 2005 or 2007 indicated by the thick line but do not pass through the propagation path 2006. This is because particles incident into an effective repulsive force range 2004 from the input terminals 2002 and 2003 make a kind of collision with each other by the interaction between the particles in the portion 2004 so that the two particles do not pass through the path 2006 when they go out of the portion 2004. As a result, the path 2006 is not connected to the path 2100 which is necessary for the particles to pass through the portion 2000. Accordingly, the output signal 2000 is "0". It is apparent from the above description that the arrangement shown in FIG. 5 forms a NOT gate.

Figure 13:
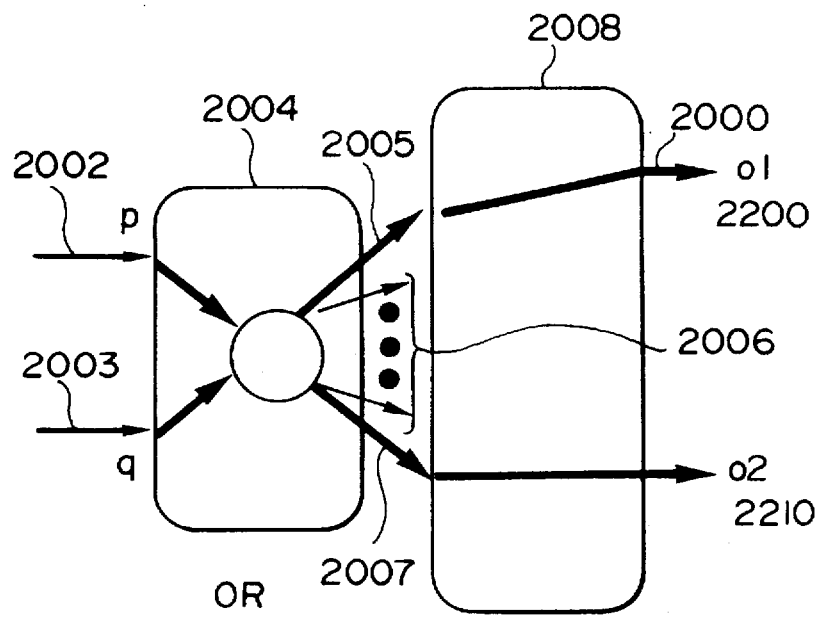
FIG. 13 shows an embodiment of a FANOUT formed according to the present invention.

Referring to FIG. 13, an embodiment of a FANOUT according to the present invention will be described below. In the portion 2008, paths are set with sufficient separation so that interaction does not occur between the paths permitting particles to pass through. In a logical operation of the FANOUT, there are required two output terminals which take an output value "1" when an input value is "1" and which take an output value "0" when an input value is "0". When the input signal 2002 is "1", a particle is detected as two output signals 2200 and 2210 by finite equal probabilities. In this logical circuit, both the two output signals take "1" because a particle is continuously introduced for a predetermined time interval which is set to be considerably longer than the time interval of introduction of an electron. When the input signal 2003 is "0", both the two output signals take "0". It is apparent from the above description that the arrangement shown in FIG. 13 provides the function of the FANOUT.

An embodiment of a wire according to the present invention will be described below. There is shown a wire for transporting particles without any delay. Because a wire without any delay is required to transport electrons linearly, the wire without any delay may be provided by arranging extra substances for setting particle paths linearly and by setting the distance of the arrangement to be sufficiently small. Wire for transporting particles with delay N may be provided by shifting the paths from the linear paths suitably. Delay N used herein means that paths through which particles run more by time N are required when the distances of running of particles are equal in the transverse direction. FIG. 13 shows a wire for transporting electrons with delay 3. It is apparent from the above description that signal delay may be provided by using various kinds of wire.

An embodiment of an operation in the case of a cylindrical honeycomb construction will be described below.

Figure 50:
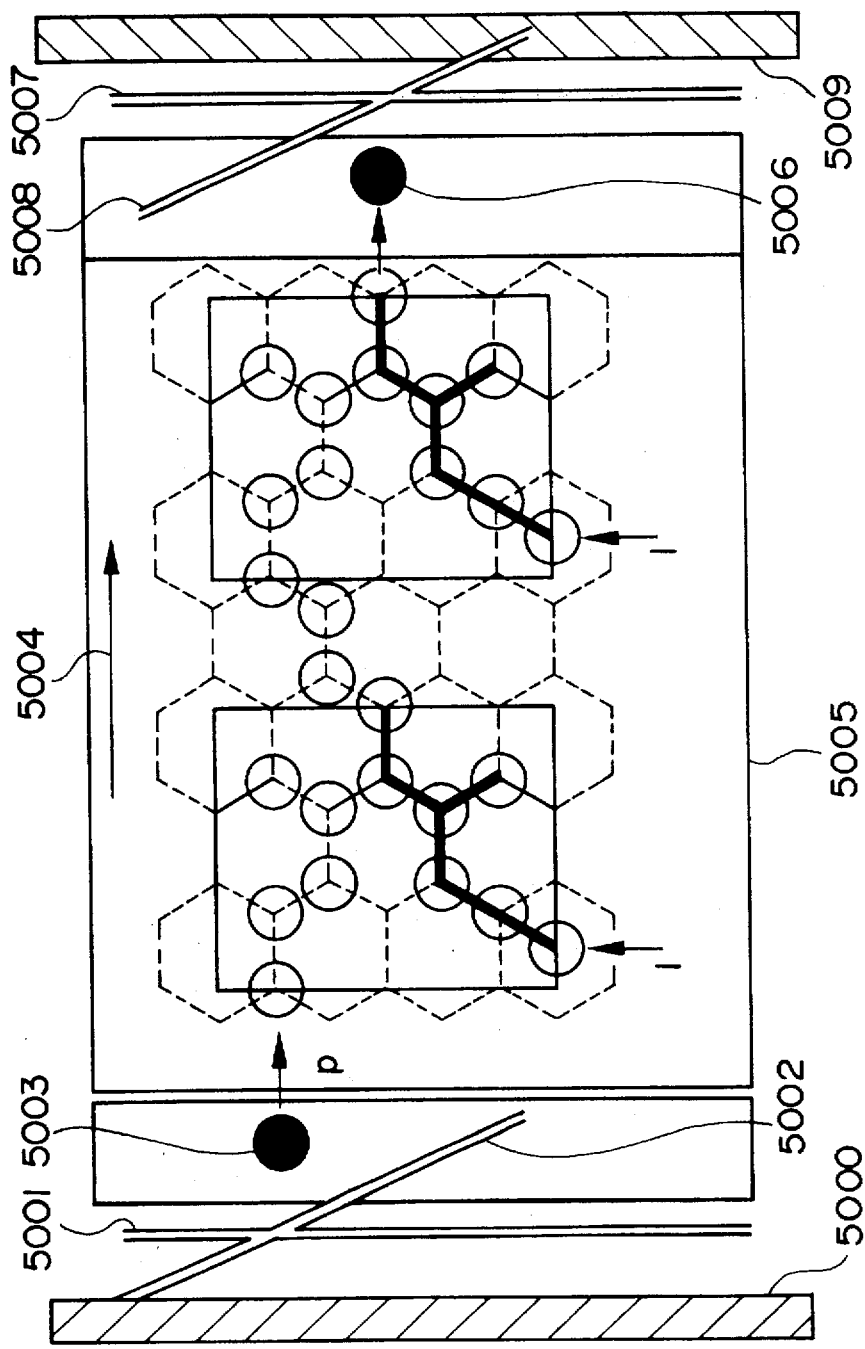
FIG. 50 is a view of input/output interfaces in a two-dimensional network.

A logical circuit 5005 shown in FIG. 50 serves as a NOR gate. The structure of the logical circuit 5005 will be described below. In the logical circuit 5005, a two-dimensional plane of a substrate for arrangement of devices is divided into a plurality of regular hexagons and conducting materials are arranged at predetermined vertices of the respective regular hexagons so that the vertices become coincident with the centers of circles in the respective bottoms of cylindrical conducting materials. The vertices at which conducting materials are arranged vary according to which desired logic. In the case where two conducting materials are arranged on the same side of one regular hexagon, the two adjacent conducting materials are connected to each other by the single-electron tunnel phenomenon through a small distance. In the case of another arrangement, connection between conducting materials caused by the tunnel phenomenon does not occur. By the presence of a connection caused by the single-electron tunnel, a signal, that is, a single electron can propagate between conducting materials without necessity of wiring.

FIGS. 5 and 6 are bird's-eye views in the case where a gate is formed by using conducting materials arranged on a two-dimensional plane. An embodiment of a machining technique for arranging materials shown in FIGS. 5 and 6 in order is as follows. First, silicon oxide is deposited as a film on a silicon substrate by using CVD. Then, circular holes are bored in the oxide film by a photoresist process. Then, tungsten silicide is grown selectively only in the inside of the holes from which the oxide film has been removed. Finally, the oxide film is removed, so that materials can be arranged in order. Particularly in the case where atoms or atomic clusters are arranged as the materials, the materials can be arranged by using an electronic scanning tunnel microscope or a field emission microscope. In the case where a GaAs substrate is used, GaAs instead of tungsten silicide is grown selectively by using the same machining technique as described above. This machining technique is a technique used in the case where quantum dots are generated.

An embodiment of the operation of the input/output circuit will be described below.

In the input/output circuit in FIG. 1, as shown in FIG. 50, point defect traps and leads as peripheral circuits which are interfaces with respect to the external signal of the single-electron circuit are arranged in the input/output portion. It has been known that the number of digits in the value of the resistivity of very thin wire is changed widely by the capture of a single electron by a trap site (K. Raals'paper in Phys. Rev. Lett. 228 (1984)). Further, the capture efficiency in single-electron traps can be made almost perfect by increasing the number of trapping sites.

In order to improve the sensitivity of the wire, the thickness of the wire is preferably selected so that there occurs Anderson localization in which electrons are located in a one-dimensional system in the condition that a potential given to electrons is random. In the case of a general metal, the thickness of the wire is about 1000 nm×1000 nm. When a helical carbon nano structure is used, the sensitivity of the wire can be improved by utilizing the characteristic of a semimetal. In FIG. 50, the reference numerals 5000 and 5009 designate portions equivalent to a source and a drain, respectively, for application of a voltage. A voltage is applied between two wires 5001 and 5002 for determining an input-side address so that an electron in a trap site 5003 is injected into a single-electron tunnel network. As a result thus obtained, an electron in a trap site 5006 is caught as the wire change of two wires 5008 and 5009 for determining an output-side address.

Figure 51:
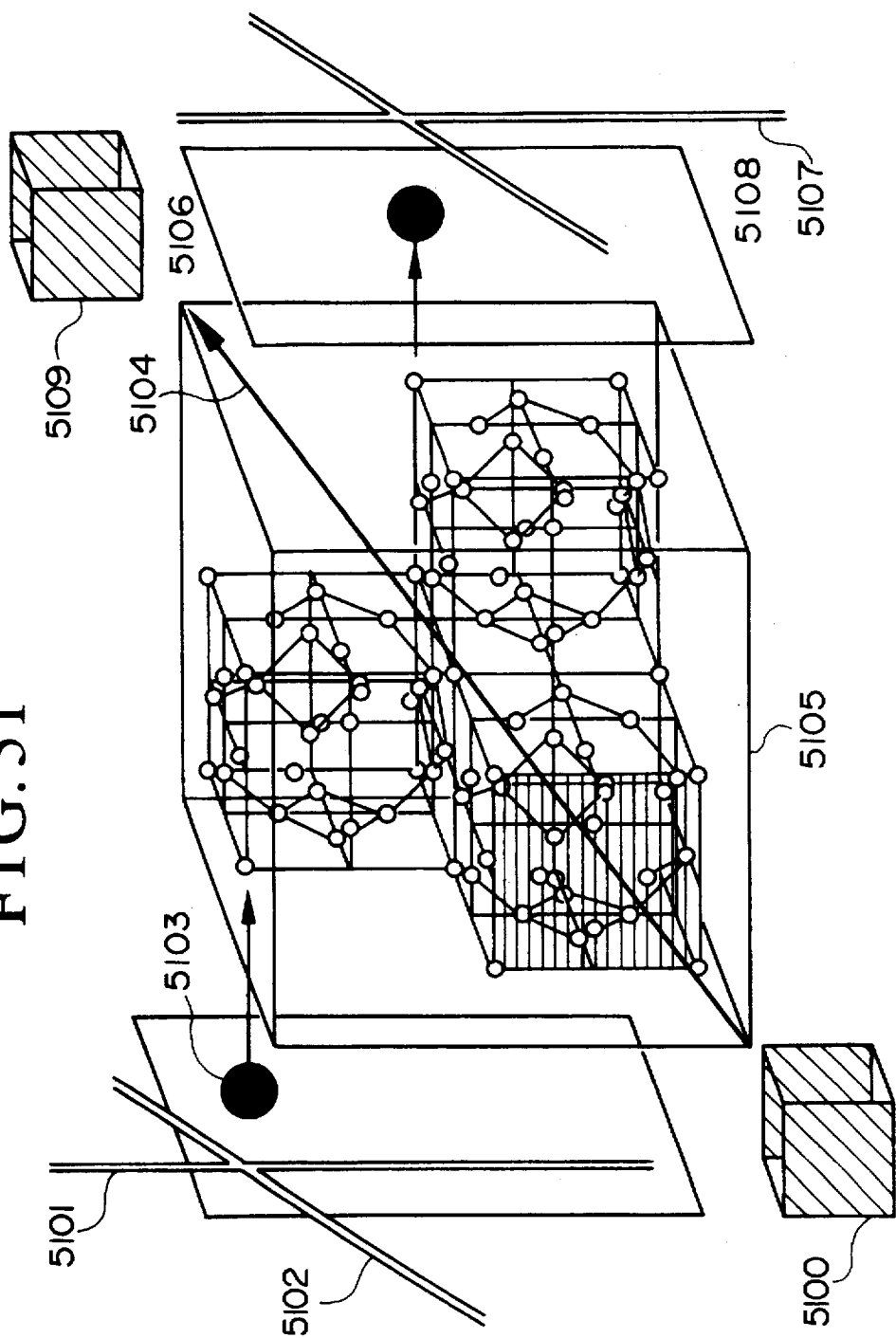
FIG. 51 is a view of input/output interfaces in a three-dimensional network.

The same rule as described above applies to the case of three dimensions. This state is shown in FIG. 51. In FIG. 51, the reference numerals 5100 and 5109 designate portions equivalent to a source and a drain, respectively, for application of a voltage. A voltage is applied between two wires 5101 and 5102 for determining an input-side address so that an electron in a trap site 5103 is injected into a single-electron tunnel network. As a result thus obtained, an electron in a trap site 5106 which is a region in which the electron does not move is caught as the wire change of two wires 5108 and 5109 for determining an output-side address.

Figure 52:
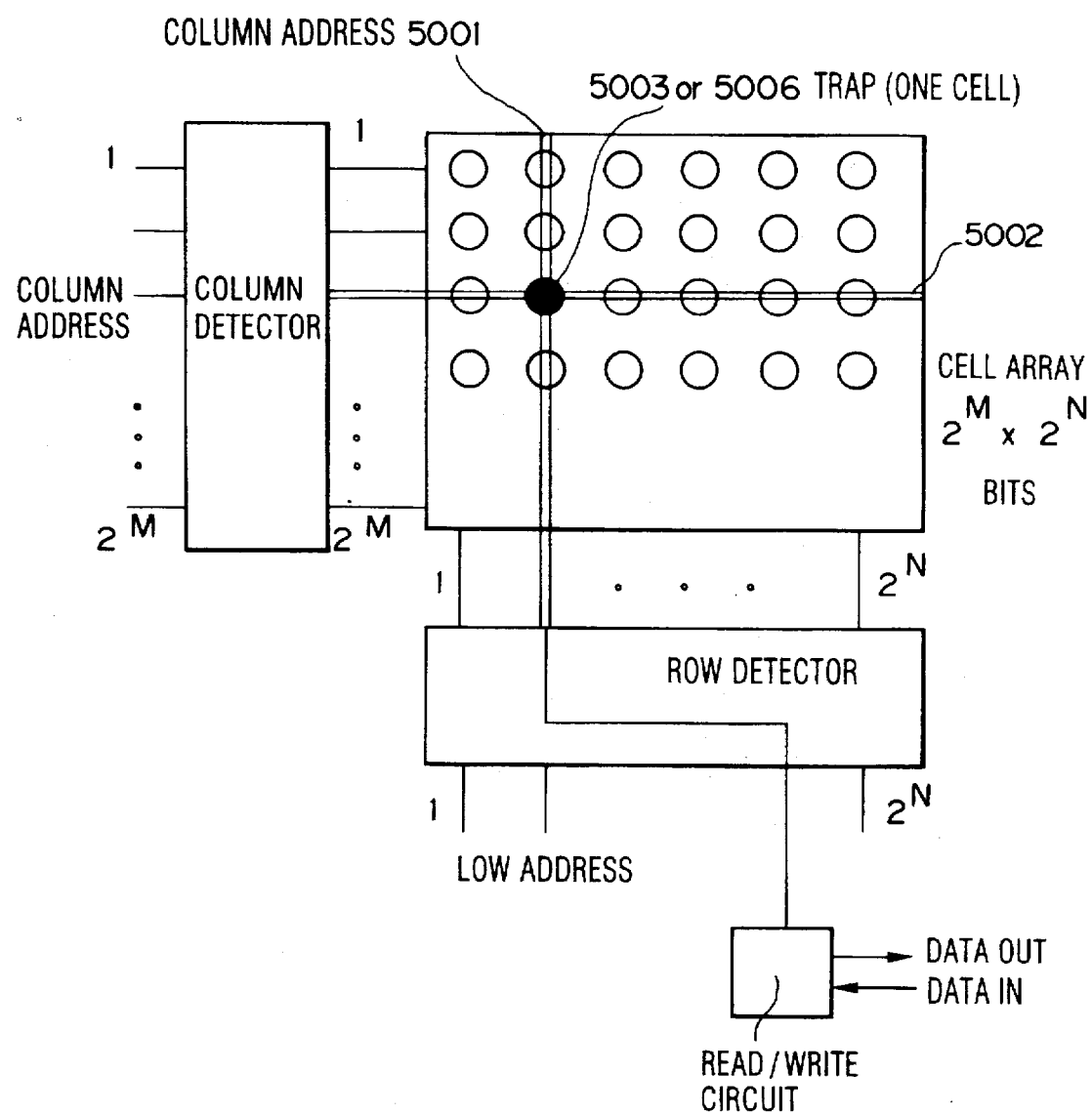
FIG. 52 is a model view of an input/output circuit.

In either case of the cases of two dimensions and three dimensions, addresses can be determined by a known method of designating the address of a random access memory as shown in FIG. 52. A voltage is applied between two wires so that a larger voltage is applied to a cross point and so that an electron is emitted from a trap position at the same time. Further, at the time of reading, a wire having the voltage increased by injection of an electron can be detected from a mesh-like wire grating by row and column detectors. Any material can be used for the wire so long as the material is very thin and looks like one dimension. For example, not only metals but also semiconductor quantum fine lines or carbon nano tubes may be used for the wire.

Figure 16:
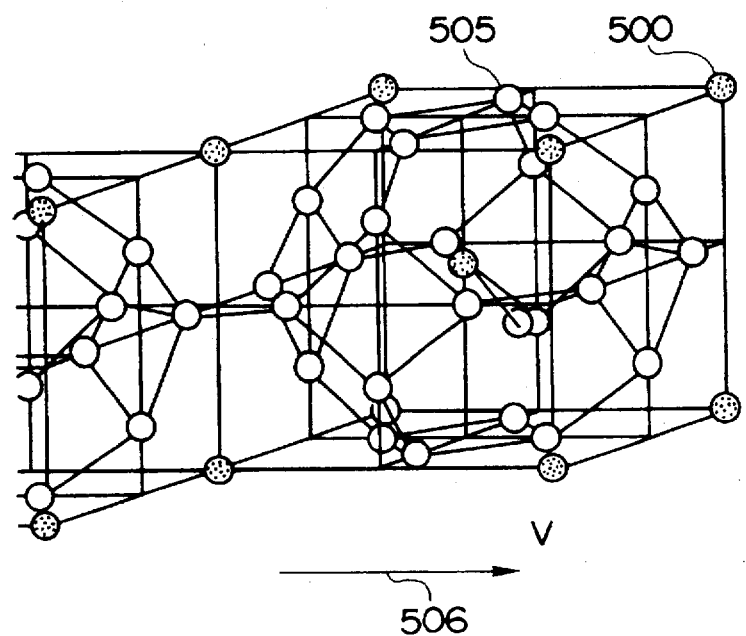
FIG. 16 is an explanatory view of a three-dimensional circuit network formed according to the present invention.
Figure 17:
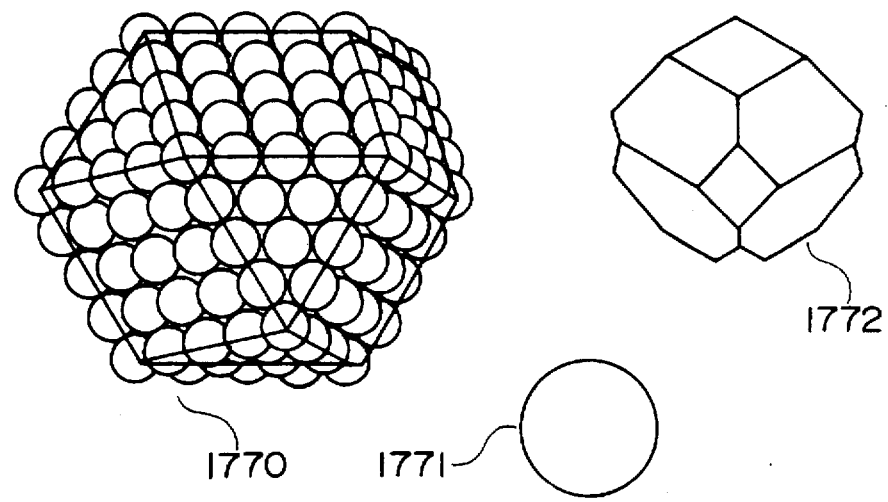
FIG. 17 shows a polyhedron closely allied to a sphere.

Further, in the case of a honeycomb construction, a voltage may be applied in the direction of the arrow 5004 in FIG. 50 so that the electric field is in parallel with one side of each hexagon. In the case where conductive materials are placed in T site positions of a BCC structure which will be described later, for the simplest handling, a voltage may be applied in the direction of the arrow 5104 in FIG. 51 so that the electric field is in parallel with the (111) plane of the BCC structure. Because T sites are located on the (100) plane of the BCC structure in this case, a uniform voltage is applied to the respective sites. Accordingly, the three-dimensional circuit is made more compact. Further, when potential is set so that the electric field is applied in the direction of the arrow 506 in FIG. 16 showing an embodiment of the present invention, the locus of movement can be detected easily.

The operating condition of a logical circuit containing spherical conducting materials arranged in a three-dimensional space will be described below.

In the wiringless logical circuit according to the present invention, a small capacitor C is formed between two spherical conductive materials. When the radius of a sphere, the distance between surfaces of the two spheres and the dielectric constant in the distance are expressed as a, d and $\epsilon_1$, respectively, the electrostatic capacitance c of the small capacitor having the facing surfaces of the two spheres as opposite surfaces is given by $c=\pi\epsilon_1 a-\log(2a/d)$ in which a satisfies a>>d, and log represents the natural logarithm. If there is no material placed between two conducting materials, $\epsilon_1$ is equal to the dielectric constant $\epsilon_0$ in a vacuum.

As the condition for connection between two conducting materials due to the single-electron tunnel phenomenon, the radius a of each of the conducting materials and the distance d between the conducting materials are determined. Assume that the radius a of each of the conducting materials and the distance d between the surfaces of the two spheres are about 100 Å and about 30 Å, respectively, then the electrostatic capacitance c of the order of femto-Farad (fF) satisfying the condition for creating the aforementioned single-electron tunneling is obtained in the conditions of a potential difference of about 0.1 V and a temperature of about 100K. In this case, the distance D (=2a+d) between the respective centers of the two spheres becomes about 230 Å.

Figure 7:
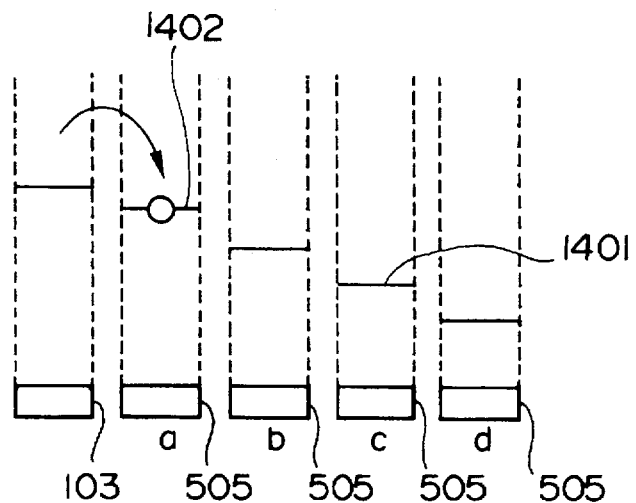
FIG. 7 is an explanatory view of the physical background on which the logical operation circuit according to the present invention is provided.
Figure 8:
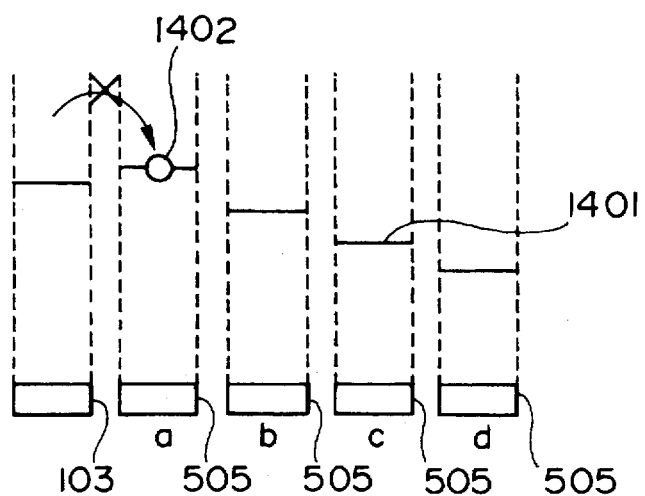
FIG. 8 is another explanatory view of the physical background on which the logical operation circuit according to the present invention is provided.

For understanding of the operation of the logical circuit according to the present invention, physical phenomena as the background of the present invention will be described now with reference to FIGS. 7, 8 and 9. As shown in FIG. 7, when an electric potential allowing single-electron tunneling is applied to columns of a plurality of conducting materials as shown in FIG. 50, an electron 1402 introduced into a signal input conducting material 103 propagates to a conducting material 505a lower in energy level 1401 and further propagates to conducting materials 505b, 505c and 505d successively. This state is generally called "coulomb blockade released state". In the case of FIG. 7, sufficient potential is applied so that the direction of the gradient of potential does not change though the single electron propagates from the conducting material 103 to the conducting material 505a. As shown in FIG. 8, in the case where the applied electric potential is, to the contrary, low so that the energy of the conducting material 505a is made higher than the energy of the conducting material 103 by tunneling the electron from the conducting material 103 to the conducting material 505a, tunneling of the electron is prohibited. This state is called "coulomb blockade state". The physical phenomenon in which tunneling of an electron is controlled by the magnitude of the applied electric potential is called "single-electron tunnel phenomenon". A threshold voltage Vt defining the transition between the aforementioned two states is given by $|Vt|=e/(2c)$, as described previously, in which e is elementary electric charge.

From the above description, the single-electron tunnel phenomenon is considered as a physical phenomenon in which an electron propagates to a position lower in energy. Concerning the background of the signal-electron tunnel phenomenon, a physical phenomenon shown in FIG. 9 plays an important role in the present invention. Assume now an applied electric potential condition ($|V|>|Vt|$) in which coulomb blockade is released. When two electrons enter into a conducting material 505b from the conducting material 505a in this case, the applied electric potential condition in which a high energy state is obtained by coulomb interaction between the two electrons is provided as follows.

When the electric potential difference between two adjacent conducting materials shown in FIG. 7 is $\Delta V$, the energy difference ΔE between the conducting materials is given by ΔE=eΔV. The increment $\delta_1$ of energy caused by entrance of one electron into the conducting material and the increment $\delta_2$ of energy caused by coulomb interaction between two electrons are given by the following Expressions 1 and 2 in voltage equivalent.

$$\delta_1 = e/(2c) \quad (\delta_1 < |\Delta E|) \tag{1}$$

$$\delta_2 = e/(4\pi\epsilon_2 a)(\delta_1 \times \delta_2 > |\Delta|) \tag{2}$$

Here, $\epsilon_2$ is the dielectric constant of the conducting material. Expression 1 shows the condition in which the electric potential after the movement of the single electron to the adjacent conducting material is made not higher than the potential of the conducting material before the movement as shown in FIG. 7, so that the direction of the gradient of electric potential does not change. Expression 2 shows the condition in which in addition to the increment of energy shown by the Expression 1, energy is increased by coulomb interaction between two electrons to thereby make the increment of energy higher than the electric potential difference between the two adjacent conducting materials as shown in FIG. 9, so that the two electrons cannot enter into the same conducting material. From the Expressions 1 and 2, the condition to be satisfied by ΔE is given by the following Expression 3.

$$\delta_1 < |\Delta E| < \delta_1 + \delta_2 \tag{3}$$

Although the above description has been made upon the case where a plurality of conducting materials are arranged in a one-dimensional direction as shown in FIG. 7, the logical circuit according to the present invention is provided with a structure in which a plurality of conducting materials are arranged in a two-dimensional plane. Accordingly, in the logical circuit according to the present invention, adjacent conducting materials are also present in the direction of the direction cosine of 1/r (r >1) with respect to the direction of application of voltage. In this case, the electric potential difference between two conducting materials is given by ΔV/r when the gradient of electric potential is uniform in the direction of application of voltage. Accordingly, the condition in the Expression 1 is given by the following Expression 4.

$$\delta_1 < |\Delta E|/r \tag{4}$$

From the Expression 4 and the condition in the Expression 2, the condition in the Expression 3 is changed as follows.

$$r\delta_1 < |\Delta E| < \delta_1 + \delta_2 \tag{5}$$

For the presence of ΔE satisfying the condition of the Expression 5, $(r-1)\delta_1 < \delta_2$ is necessary. Therefore, when the already given equation expressing the electrostatic capacitance c of the small capacitor is used, $(r-1)\delta_1 < \delta_2$ is expressed by the following expression:

$$(\epsilon_2/\epsilon_1) < \log(2a/d)/(2(r-1)) \tag{6}$$

in which $(\epsilon_2/\epsilon_1)$ is the ratio of the dielectric constant of the conducting material to the dielectric constant of the distance and the ratio has a value of about 1 to about 10.

Further, when the equation expressing the electrostatic capacitance c of the small capacitor is used in the preliminarily described temperature condition $T < e^2/(2ck)$ allowing single-electron tunneling, the following Expression 7 is obtained.

$$e^2/(kT) > 2\pi\epsilon_1 a \cdot \log(2a/d) \tag{7}$$

When the radius a of each of the spherical conducting materials is given, the following expression is obtained as the condition to be satisfied by the distance d from the Expressions 6 and 7.

$$2(r-1)(\epsilon_2/\epsilon_1) < \log(2a/d) < e^2/(2\pi\epsilon_1 akT) \tag{8}$$

For the presence of d satisfying the condition of the Expression 8, it is necessary that the upper limit and the lower limit in the Expression 8 satisfy the relation $2(r-1)(\epsilon_2/\epsilon_1) < e^2/(2\pi\epsilon_1 akT)$. From this condition, the upper limit of the operating temperature determined on the basis of the radius a of each sphere is expressed as follows.

$$T < e^2/(4\pi\epsilon_2 ak(r-1)) \tag{9}$$

Figure 9:
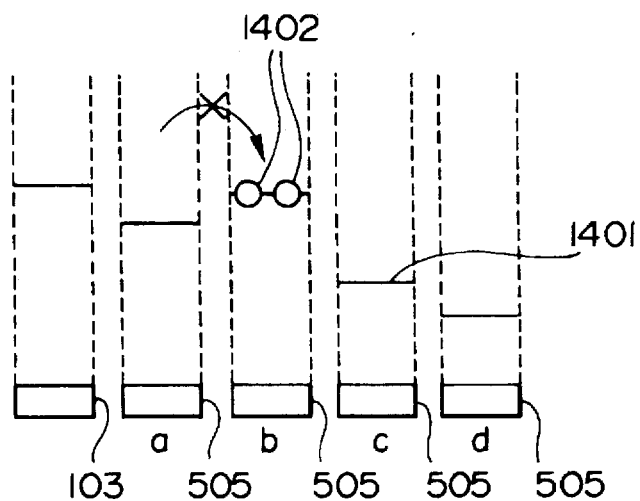
FIG. 9 is a further explanatory view of the physical background on which the logical operation circuit according to the present invention is provided.

Although FIG. 9 is a view in which conducting materials are arranged one-dimensionally, electrons may try to enter into one conducting material from different directions in the case where conducting materials are arranged two-dimensionally or three-dimensionally. In this case, two electrons cannot enter into the conducting material simultaneously because of the mechanism shown in FIG. 9, that is, coulomb blockade and coulomb interaction.

Figure 49:
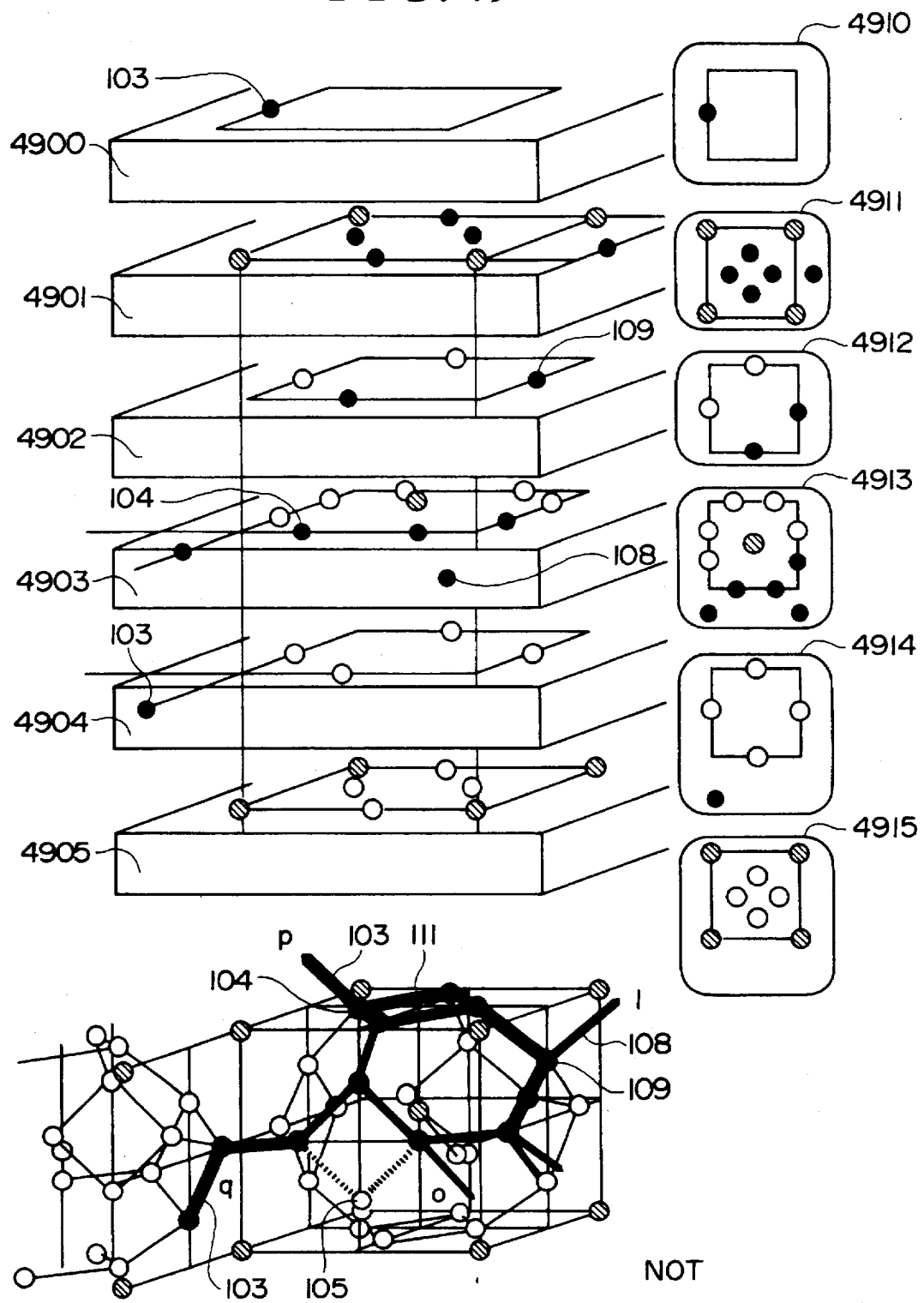
FIG. 49 is a model view of a process for producing a network formed according to the present invention.

FIG. 49 shows an embodiment of the method of producing a three-dimensional network. In FIG. 49, the black dots represent positions where conducting materials are placed, and the gray (hatched line) dots represent positions where materials are placed when a BCC (body-center cubic) lattice is formed. The white dots represent positions where insulators formed of the same material as substrates 4900 to 4905 are placed. An embodiment of the machining technique for arranging materials regularly to form a logical circuit indicated by the thick solid line in FIG. 49 is as follows.

First, silicon oxide is deposited as a film on a silicon substrate 4905 by using CVD. In any case of substrates 4900 to 4905, the thickness of deposition is ¼ of the distance a in each tetragonal lattice in the BCC lattice. As for the substrate 4905, conducting materials different from conducting materials placed in the black dots may be placed in the BCC lattice positions so as to be used for shielding between T positions. Otherwise, none is placed on the substrate 4905. Then, silicon oxide 4904 is deposited as a film. At the same time, the following operation is carried out to place conducting materials in the black dot positions in the substrate 4904 with respect to the BCC lattice. Then, a circular hole is bored in the black dot position of the oxide film. Then, tungsten silicide is grown selectively only in the inside of the hole from which the oxide film has been removed.

Finally, the oxide film is removed, so that materials can be arranged regularly. Insertion views 4910 to 4915 show respective positional relations from the top. As for the substrates 4903, 4902, 4901 and 4900, conducting materials are also placed in the black dot positions, materials the same as that of the substrates are placed in the white dot positions, and materials different from the materials placed in the black dots are placed in the gray dot positions as occasion demands. The substrates 4900 to 4905 are formed by deposition, holes are bored in the substrates and conducting materials are placed in the black dot positions by selective growth in the same manner as described above. Thus, there is produced a NOT circuit indicated by the thick solid line formed by connecting the black dots as shown in the lower portion of FIG. 49. Other circuits and circuit connections may be produced by arranging conducting materials two-dimensionally in positions shifted by a/4 in the same manner as described above.

Figure 41:
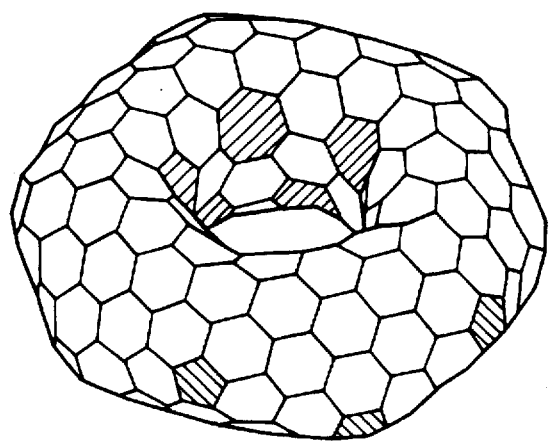
FIG. 41 shows an embodiment of the structure of a torus network formed according to the present invention.
Figure 42:
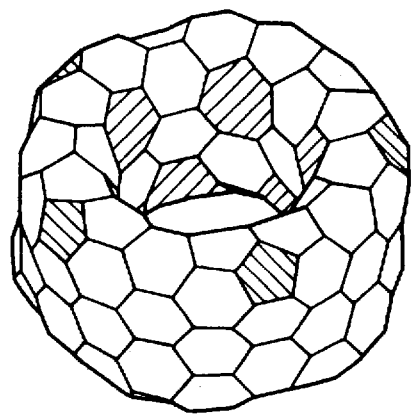
FIG. 42 shows another embodiment of the structure of a torus network formed according to the present invention.
Figure 43:
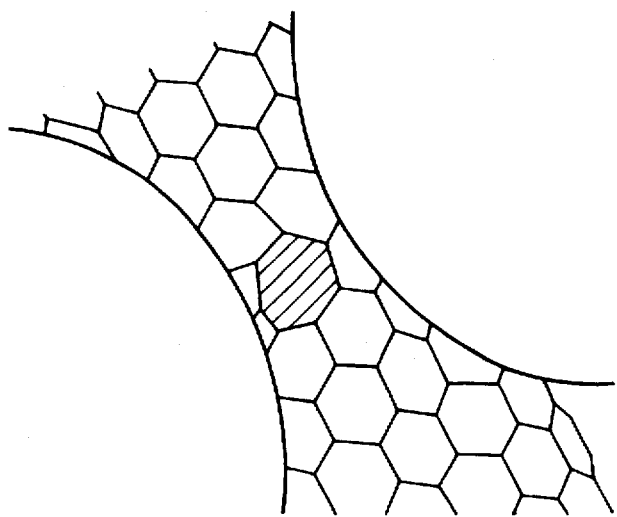
FIG. 43 shows an embodiment of the structure of a sponge-like network with negative curvature formed according to the present invention.

Instead of selective growth, atoms or atomic clusters may be placed directly while the atoms or atomic clusters are moved and arranged under an electronic scanning tunnel microscope or a field emission microscope. In this case, shapes as shown in FIGS. 41, 42 and 43 may be produced by thin silicon oxide films so that conducting materials are placed in vertex positions.

In the case where a GaAs substrate is used as a substitute for the silicon substrate, GaAs is grown selectively instead of tungsten silicide by using the same machining technique as described above. This machining technique is a technique used in the case where quantum dots are generated.

An embodiment of a three-dimensional network will be described below.

FIG. 16 shows an embodiment of a three-dimensional wiringless logical circuit according to the present invention. The logical circuit indicated by the thick solid line in FIG. 21 serves as an OR gate as shown in FIG. 2. The structure of the logical circuit will be described below.

An example of the three-dimensional arrangement in which propagation of a single electron can be controlled will be described now. A general three-dimensional arrangement structure can be used. Because the circuit has no wiring, a three-dimensional network can be produced easily. The number of terminals vary according to the number of coordinations (the number of nearest arrangements) in the arrangement structure. In the case of a face-center cubic lattice, the coordination number is 12. This example will be described upon the case where a space is divided by tetrahedron positions (hereinafter referred to as "T positions") called 12(d) positions obtained from the body-center cubic lattice (the black dot positions in FIG. 1) to thereby form lattices.

All the nearest distances between the T positions are equal to each other. According to this arrangement, lattices may be composed efficiently because this arrangement is high in density and can be formed easily by the current machining technique. When the number of black dots is two in one body-center cubic lattice, the number of T positions is 12. Four nearest T arrangements exist correspondingly to each of the T positions. Accordingly, there is obtained an atomic cluster 1770 shaped like a polyhedron near a sphere. An embodiment in which conducting materials are produced as designated by the reference numerals 1771 and 1772 and placed in the T positions will be described now. Here, the sphere 1770 represents an atom. This atom need not be a metal so long as the cluster is metallic.

The vertices (505 in FIG. 16) where conducting materials are arranged vary according to desired logic. In the case where two conducting materials are arranged in nearest positions, these two conducting materials are connected to each other by the single-electron tunneling phenomenon. In the case where two conducting materials are arranged in other positions than the nearest positions, there is no connection between the conducting materials by the tunneling phenomenon. By the presence of connection caused by the single-electron tunneling, a signal, that is, an electron can propagate between conducting materials without necessity of wiring.

Further, the connection caused by the single-electron tunneling phenomenon is limited by the method of arrangement of conducting materials. Accordingly, propagation of an electron can be controlled by changing the arrangement of conducting materials, so that a circuit, in FIG. 21, having an logical operation function can be formed. As the condition for connection between two conducting materials, the distance between the nearest lattice points and the radius of each of conducting materials are determined. When the radius of each of the conducting materials is about 100 Å, the distance between the nearest lattice points becomes about 230 Å.

Figure 27:
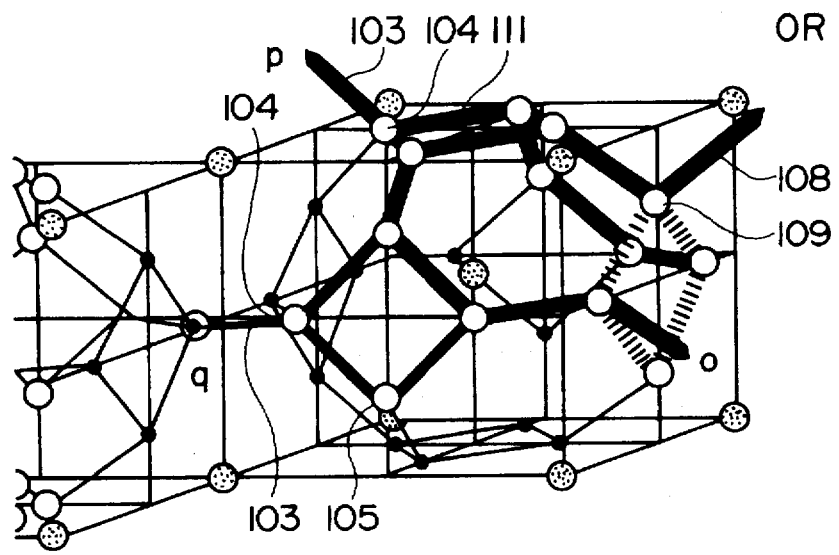
FIG. 27 is an explanatory view of signal propagation in the three-dimensional OR gate formed according to the present invention.

As shown in FIG. 27, conducting materials arranged in predetermined positions include conducting materials 104 for performing inputting 103 for a logical operation, conducting materials for inputting a predetermined signal, that is, a constant, and conducting materials 109 for performing outputting 108 of a result of the logical operation, as conducting materials having special functions. Other conducting materials 105 are used for performing the logical operation.

Figures 21, 22:
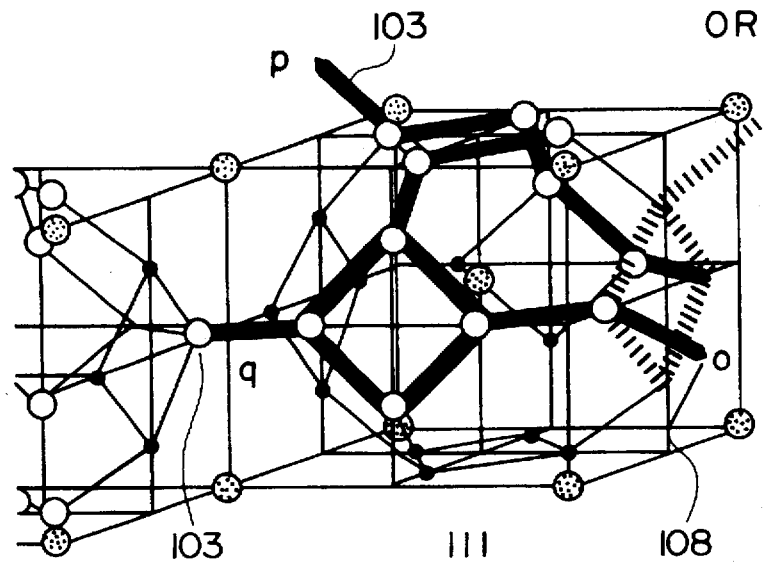
FIG. 21 shows an embodiment of a three-dimensional OR gate formed according to the present invention.
FIG. 22 shows an embodiment of a three-dimensional OR logical operation formed according to the present invention.

In FIG. 21, two conducting materials 104 are used for performing inputting for a logical operation and one conducting material 109 is used for outputting a result of the logical operation. That is, the logical circuit is considered as a two-input one-output logical operation gate. Generally, the logical circuit is a multi-input multi-output circuit. The inputting of a constant 103 is not always required so long as the desired logical operation does not require it.

In the present invention, the excess state of one electron in a conducting material is expressed as logic "1" whereas the normal state thereof is expressed as logic "0". The state in which an electron is introduced into a predetermined signal input conducting material 104 at a certain time interval by applying a negative electric potential to the conducting material 104 is expressed as an input state "1". The time interval for introduction of the electron is determined by the magnitude of the applied electric potential. Whether the introduced electron can propagate between the conducting materials 105 and finally can reach the signal output conducting material 108 or not, corresponds to a result "1" or "0" of the logical operation. FIG. 22 shows output results 108 in accordance with predetermined input conditions 103 given to the logical circuit 101 shown in FIG. 21.

For the understanding of the operation of the logical circuit shown in FIG. 21, physical phenomena as the background of the present invention will be described now with reference to FIGS. 7, 8 and 9. As shown in FIG. 7, when an electric potential allowing single-electron tunneling is applied, an electron 1402 introduced into a signal input conducting material 103 propagates to a conducting material 105 lower in energy level 1401 (1402). This state is generally called "coulomb blockade released state".

As shown in FIG. 8, in the case where the applied electric potential is, to the contary, contrariwise low so that energy is made higher by tunneling of the electron, tunneling of the electron is prohibited. This state is called "coulomb blockade state". The physical phenomenon in which tunneling of an electron is controlled by the magnitude of the applied electric potential as described above is called "single-electron tunnel phenomenon".

From the above description, the single-electron tunnel phenomenon is considered as a physical phenomenon in which an electron propagates to a position lower in energy. Concerning the background of the signal-electron electron tunnel phenomenon, a physical phenomenon shown in FIG. 9 plays an important role in the present invention. Assume now an applied electric potential condition in which coulomb blockade is released. When two electrons enter into one conducting material in this case, the applied electric potential condition in which a high energy state is obtained can be realized easily.

Although FIG. 9 is a view in which conducting materials are arranged one-dimensionally, electrons may try to enter into one conducting material from different directions in the case where conducting materials are arranged two-dimensionally or three-dimensionally. In this case, two electrons cannot enter into the conducting material simultaneously because of the mechanism shown in FIG. 9, that is, coulomb blockade. Incidentally, when electrons are used for compensating peripheral potential, the maximum number of electrons allowed to enter into one conducting material is not always two.

Figure 18:
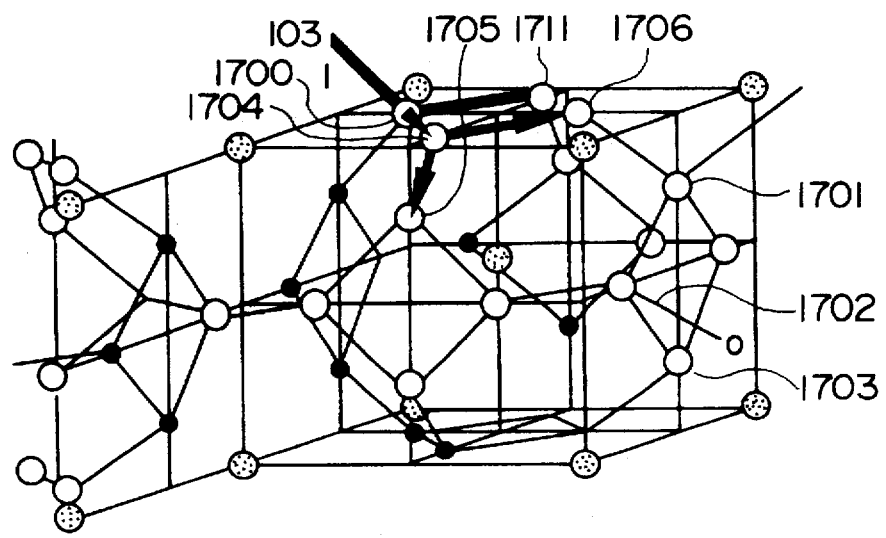
FIG. 18 is an explanatory view of the physical background on which the three-dimensional logical operation circuit according to the present invention is provided.
Figure 19:
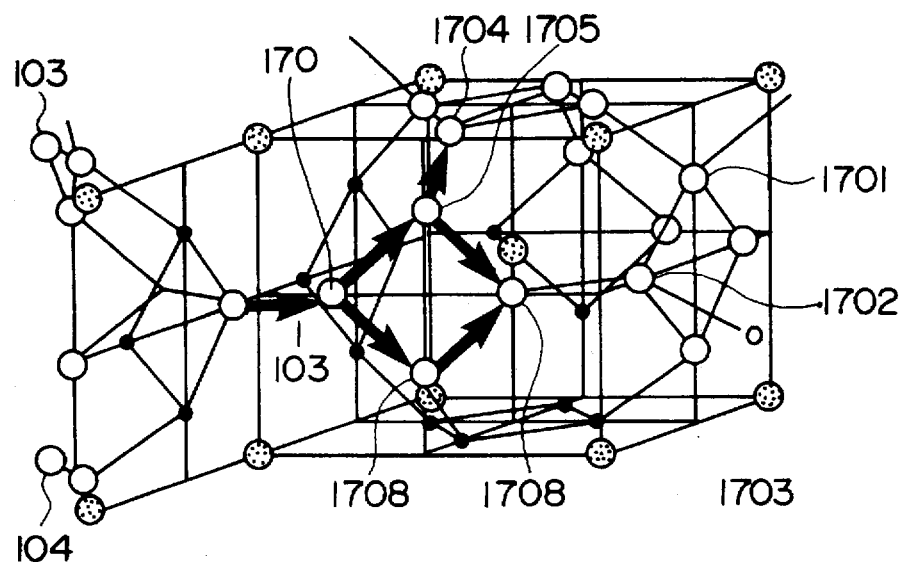
FIG. 19 is another explanatory view of the physical background on which the three-dimensional logical operation circuit according to the present invention is provided.
Figure 20:
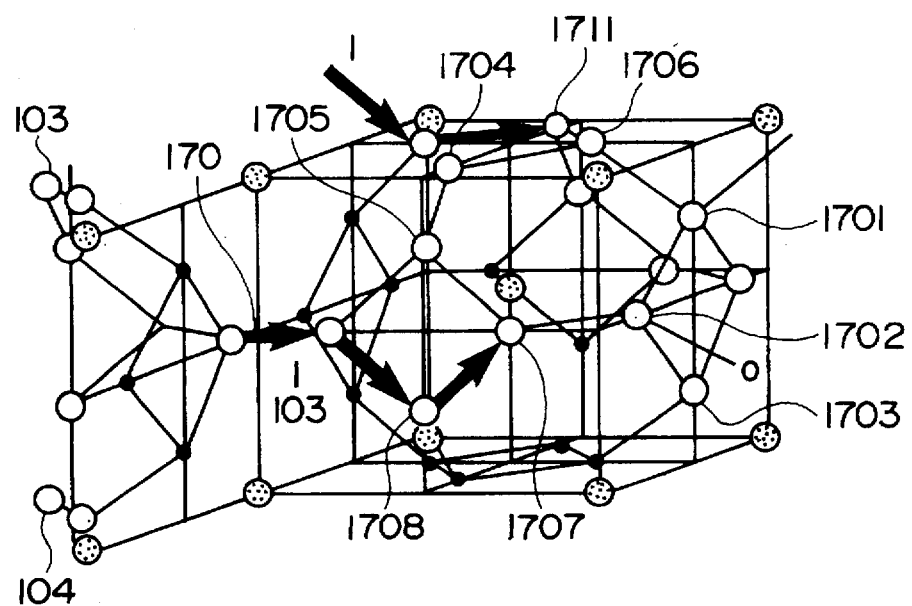
FIG. 20 is a further explanatory view of the physical background on which the three-dimensional logical operation circuit according to the present invention is provided.

The state in which an electron propagates between conducting materials arranged three-dimensionally will be described below with reference to FIGS. 18, 19 and 20. The arrangement of conducting materials shown in FIGS. 18, 19 and 20 is a fundamental of the arbitrary conducting material arrangement in the present invention. Assume now the case where an electron is injected into a conducting material 1700 as shown in FIG. 18. Assume that the electric field is applied in the (100) direction in this case. That is, a (100) plane opposite to a (100) plane in each of conducting materials 1701, 1702 and 1703 has higher energy by external potential than the (100) plane. That is, potential is set so that the electric field is applied in the direction of the arrow 506 in FIG. 16. This corresponds to the inputting of a signal 1 into the conducting material 1700. In this case, electrons pass through the conducting material 1704 one by one and flow into the conducting material 1705 or 1711 in the probability of ¼. Then, electrons flow into the conducting material 1706 from the conducting materials 1711 and 1704. On the other hand, the flow of electrons into the conducting material 1703 is prohibited because the energy of the conducting material 1707 is higher than the energy of the conducting material 1702. Further, the tunneling of electrons is prohibited when conducting materials are not located in nearest positions.

FIG. 19 shows the state of propagation of electrons when a signal "1" is inputted to a conducting material 170 in the case where conducting materials are arranged in the same manner as in FIG. 18. In the consideration with respect to this case in the same manner as in FIG. 18, the signal "1" is given to the conducting materials 1705 and 1708.

FIG. 20 shows the state of propagation of electrons when a signal "1" is inputted to a conducting material 170 and at the same time a signal "1" is inputted to a conducting material 1700 in the case where conducting materials are arranged in the same manner as in FIGS. 18 and 19. Although the behavior of one electron is considered in the cases of FIGS. 18 and 19, the behaviors of two electrons must be considered in this case because electrons flow from the two conducting materials 1700 and 170. In this case, the flow of the electron into the conducting material 1705 is prohibited by the physical phenomenon shown in FIG. 9. Accordingly, the signal "1" is given to the conducting material 1707 through the conducting material 1708, and the signal "0" is given to the conducting material 1705.

It is apparent from the above description that the arrangement of conducting materials shown in FIGS. 18, 19 and 20 forms a circuit for performing a logical operation of EOR. Not only the OR gate and the NOT gate but also a FANOUT and a wire can be formed based on the fundamental arrangement shown here. Any logical circuit can be composed theoretically so long as the OR gate, the NOT gate, the FANOUT and the wire can be formed.

FIG. 21 shows an embodiment of an OR gate according to the present invention. FIG. 22 shows the logical operation of the OR gate. The OR gate shown in FIG. 21 outputs one result 108 of an arithmetic operation in response to two inputs 103. The reason why the arrangement of conducting materials shown in FIG. 21 gives the arithmetic operation shown in FIG. 22 will be described with reference to FIGS. 27, 28 and 29. As shown in FIG. 27, when one input p of the signal 103 is "1" and the other input q of the signal 103 is "0", electrons take the propagation path indicated by the thick solid line. Accordingly, the output signal 108 is "1".

Figure 28:
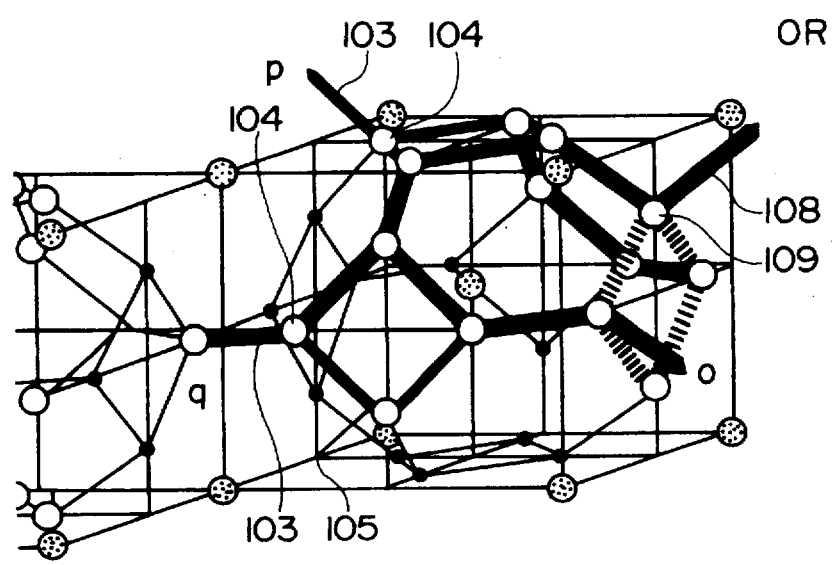
FIG. 28 is another explanatory view of signal propagation in the three-dimensional OR gate formed according to the present invention.
Figure 29:
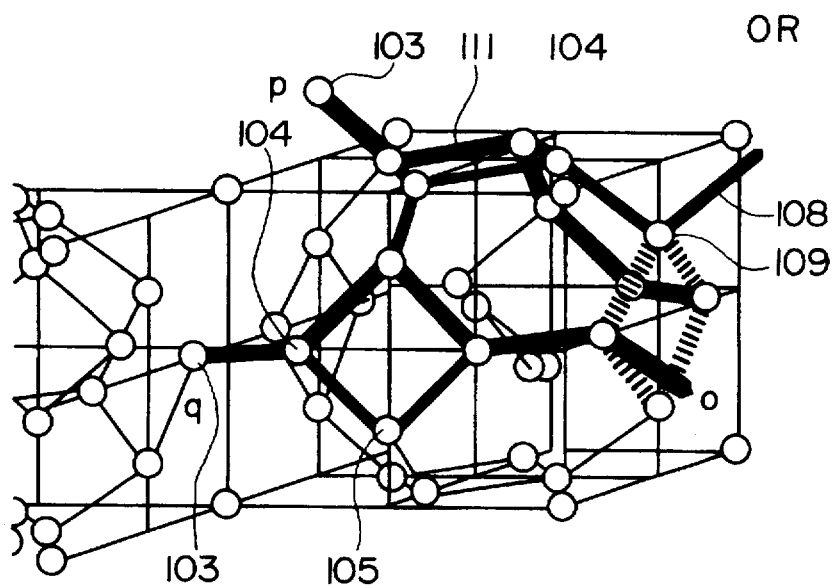
FIG. 29 is a further explanatory view of signal propagation in the three-dimensional OR gate formed according to the present invention.

As shown in FIG. 28, when one input p of the signal 103 is "0" and the other input q of the signal 103 is "1", electrons take the propagation path indicated by the thick solid line. Accordingly, the output signal 108 is "1". As shown in FIG. 29, when one p of the input signals 103 is "1" and the other q is "1", electrons take the propagation path indicated by the thick solid line. Accordingly, the output signal 108 is "1". Contrariwise, when one input p of the signal 103 is "0" and the other input q of the signal 103 is "0", propagation of electrons does not occur. Accordingly, the output signal 108 is "0". It is apparent from the above description that the arrangement shown in FIG. 21 forms an OR gate.

Figures 23, 24:
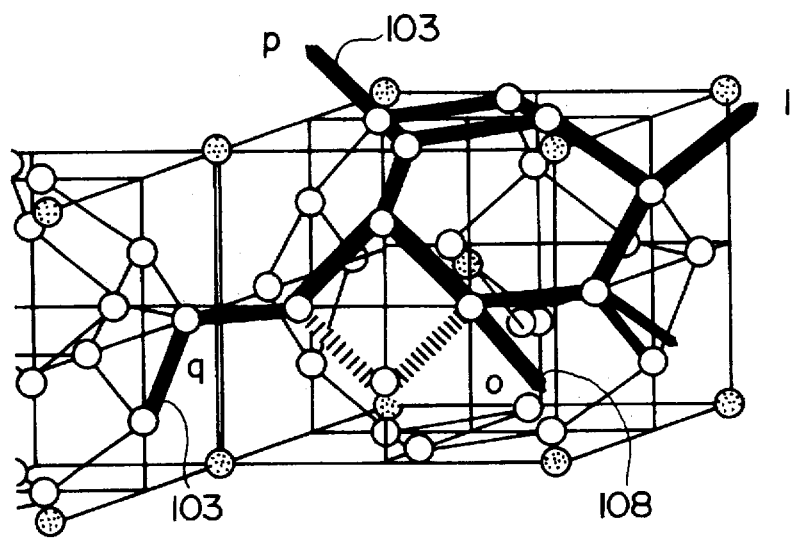
FIG. 23 shows an embodiment of a three-dimensional NOT gate formed according to the present invention.
FIG. 24 shows an embodiment of a three-dimensional NOT logical operation formed according to the present invention.
Figure 31:
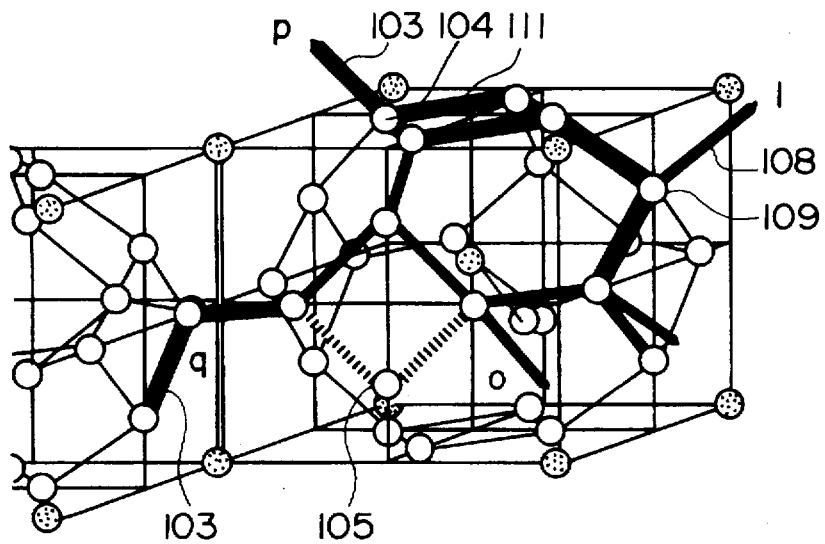
FIG. 31 is an explanatory view of signal propagation in the three-dimensional NOT gate formed according to the present invention.
Figure 32:
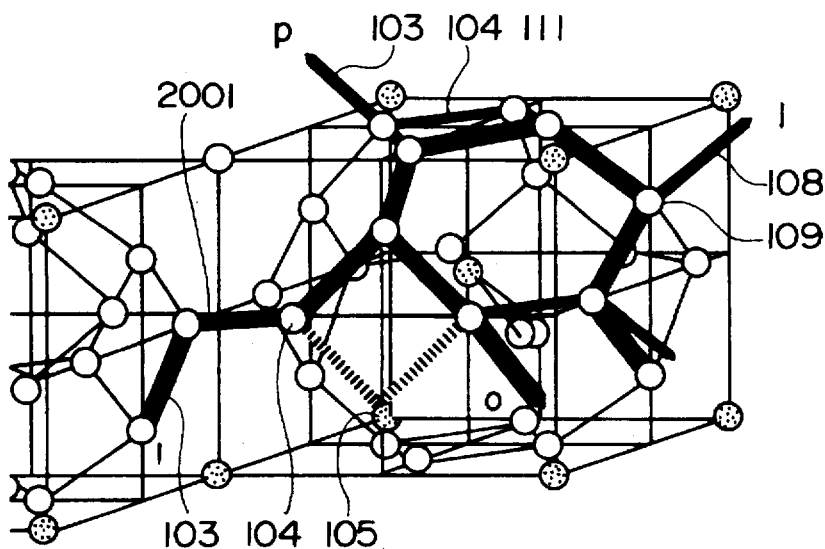
FIG. 32 is another explanatory view of signal propagation in the three-dimensional NOT gate formed according to the present invention.

FIG. 23 shows an embodiment of a NOT gate according to the present invention. FIG. 24 shows the logical operation of the NOT gate. The NOT gate shown in FIG. 23 outputs one result 108 of an arithmetic operation in response to one input 103. The NOT gate is however different from the OR gate in that a signal having a constant value "1" is given as a constant input 106 in the NOT gate. The reason why the arrangement of conducting materials shown in FIG. 23 gives an arithmetic operation shown in FIG. 24 will be described below with reference to FIGS. 31 and 32. As shown in FIG. 31, when the input signal 103 is "0", the constant input 106 is used singly so that electrons take the propagation path indicated by the thick solid line. Accordingly, the output signal 108 is "1". As shown in FIG. 32, when the input signal 103 is "1", electrons pass through the propagation path 2001 indicated by the thick solid line. Accordingly, the output signal 108 is "0". It is apparent from the above description that the arrangement shown in FIG. 23 forms a NOT gate.

Figure 33:
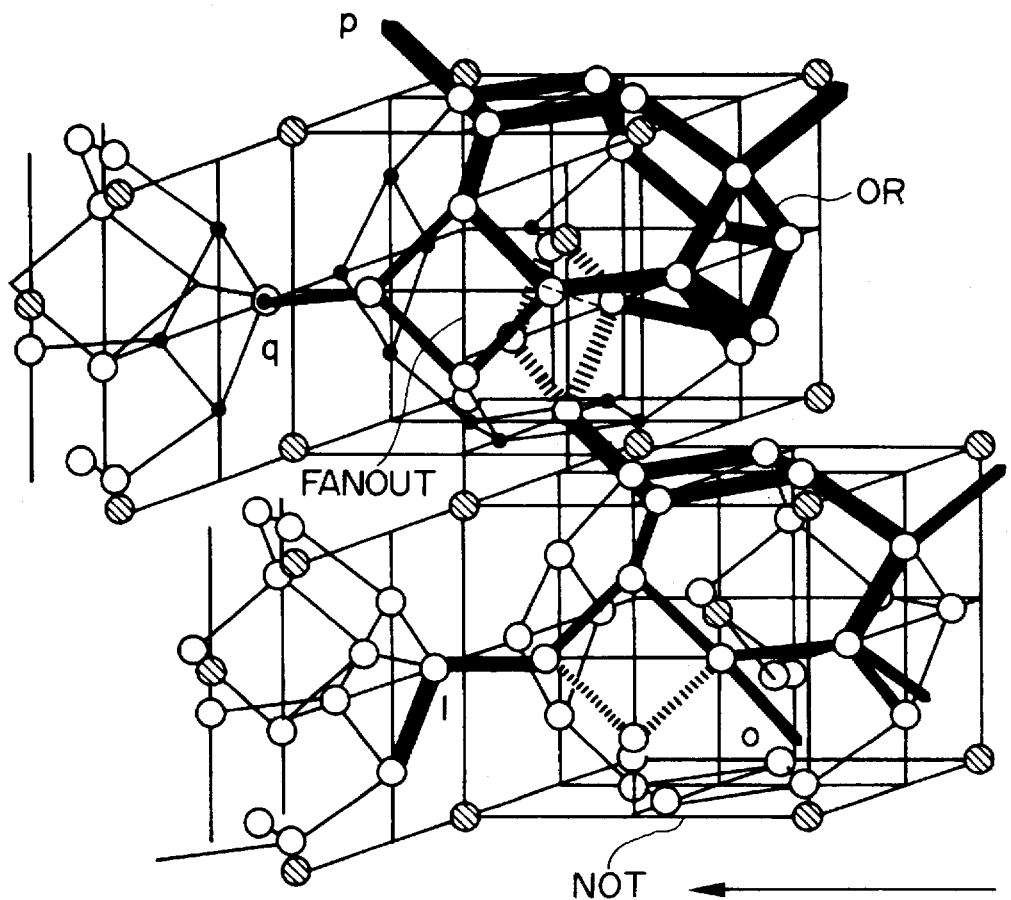
FIG. 33 is a view showing an embodiment of signal propagation in a three-dimensional NOR gate formed according to the present invention.
Figure 34:
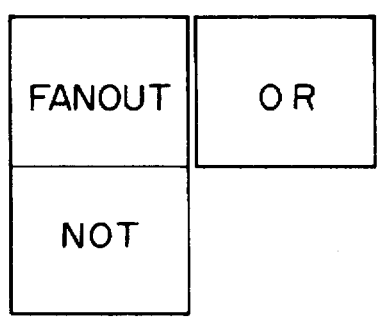
FIG. 34 is a view showing another embodiment of signal propagation in the three-dimensional NOR gate formed according to the present invention.

The fact that the logical circuit shown in FIG. 33 serves as a NOR gate can be understood from the fact that the circuit is composed of an OR gate 2701 and a NOT gate 2702.

Figures 25, 26:
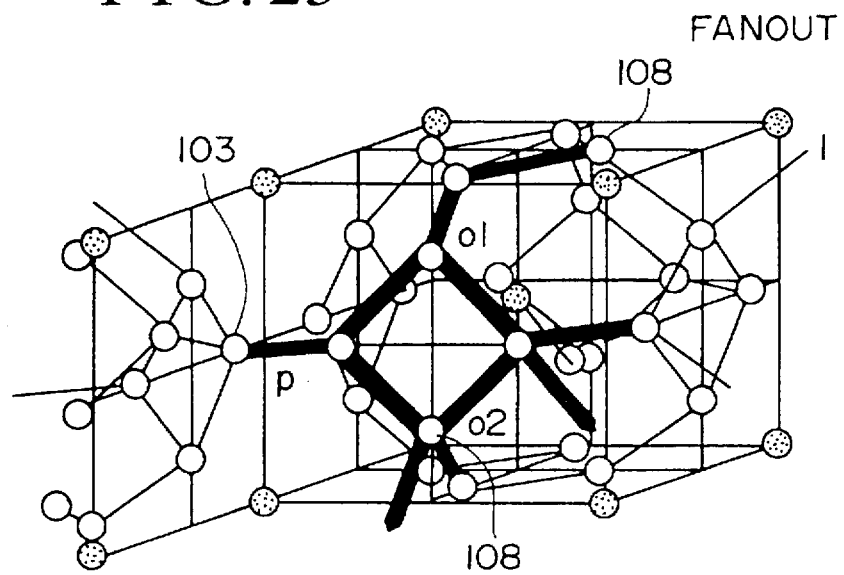
FIG. 25 shows an embodiment of a three-dimensional FANOUT gate formed according to the present invention.
FIG. 26 shows an embodiment of a three-dimensional FANOUT logical operation formed according to the present invention.

FIG. 25 shows an embodiment of a FANOUT of a three-dimensional circuit according to the present invention. FIG. 26 shows the logical operation of the FANOUT. When the input signal 103 is "1", an electron is detected as two output signals 108 in the probability of ½. In this logical circuit, an electron is introduced continuously for a predetermined time interval which is considerably longer than the time interval for introduction of an electron, so that both the output signals take "1". When the input signal 103 is "0", both the output signals take "0". It is apparent from the above description that the arrangement shown in FIG. 25 provides the function of the FANOUT.

Figure 30:
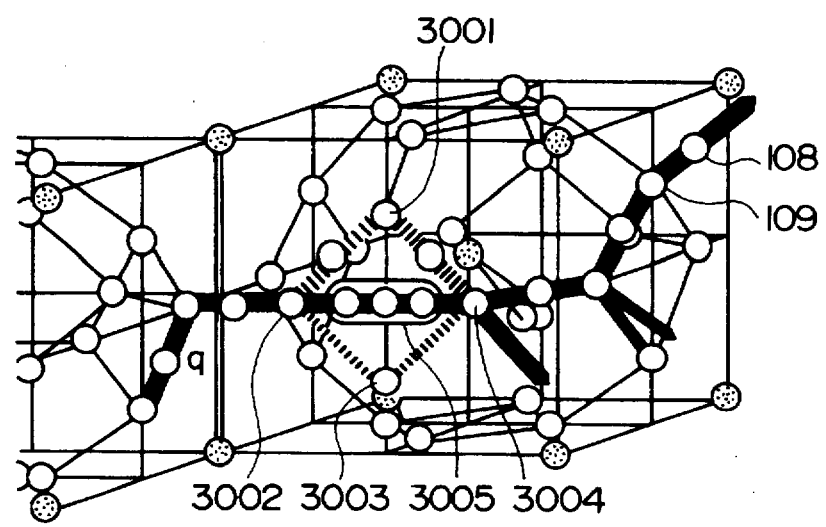
FIG. 30 is an explanatory view of signal propagation in three-dimensional wire formed according to the present invention.

In the following, an embodiment of a wire according to the present invention will be described with reference to FIG. 30. Wire for transporting electrons without any delay may be expressed by a straight line. Because a wire without any delay is required to transport electrons linearly, the wire without delay can be achieved by the arrangement 3005 in which conducting materials are arranged exceptionally to pass through the center of conducting materials 3001, 3002, 3003 and 3004. In FIG. 30, the broken line passing through the conducting materials 3002, 3001 and 3004 expresses wire for transporting electrons with delay 2. Here, delay 1 means that electrons must run longer by the nearest distance between T positions compared with the case of FIG. 11 when the distances of running of electrons are equal in the transverse direction. From the above description, signal delay control can be provided by using various kinds of wire.

Figure 35:
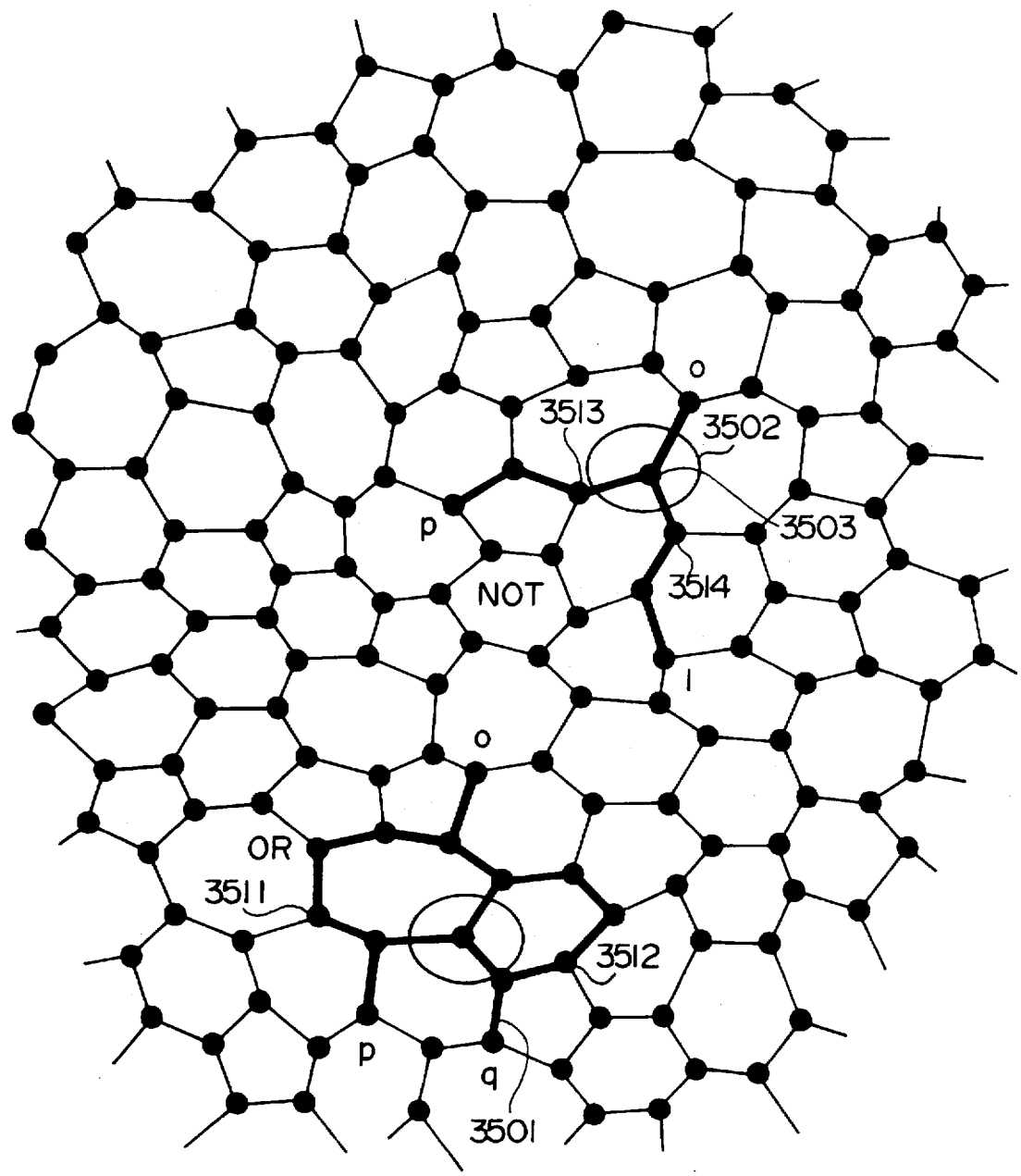
FIG. 35 shows an embodiment of an OR gate and a NOT gate in a two-dimensional random lattice formed according to the present invention.

Although Japanese Patent Application No. 6-27710 describes the case where lattices are assembled in the form of regular hexagons, the condition may be loosened more. As shown in FIG. 35, OR 3501 and NOT 3502 gates can be composed on random lattices arranged at intervals of an almost equal distance. In FIG. 35, the white ellipse shows that electrons in positions 3511 and 3512 or in positions 3513 and 3514 scatter. When the input P is "1" in the case of a NOT gate, electrons cannot go to a position 3503 because of interaction, so that the output becomes "0".

Figure 36:
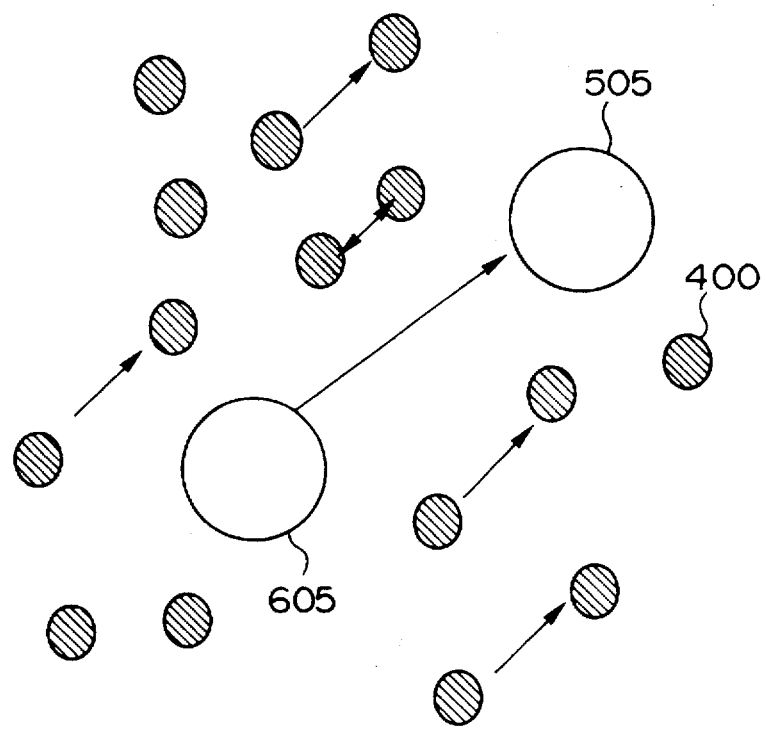
FIG. 36 is an explanatory view of use of a shielding effect formed according to the present invention.

FIG. 36 shows a mechanism in which capacitance is increased by shielding caused by an influence given to peripheral electrons when an electron moves. By the shielding effect, the dielectric constant is increased, so that the single-electron tunneling is hard to occur. As against the effect of tunneling in a certain position, however, there arises an effect that tunneling is made hard to occur in another position or contrariwise made easy to occur in another position. When other electrons move in the same direction as the direction of tunneling as shown in FIG. 36, tunneling is made easy to occur in other positions in this direction in other places. When other electrons move in the direction perpendicular to the direction of tunneling as shown in FIG. 36, tunneling is made hard to occur in other places. Therefore, when the network according to the present invention is put between ferroelectric substances in the form of a sandwich, interference between respective layers is suppressed so that a large number of networks can be laminated.

Figure 37:
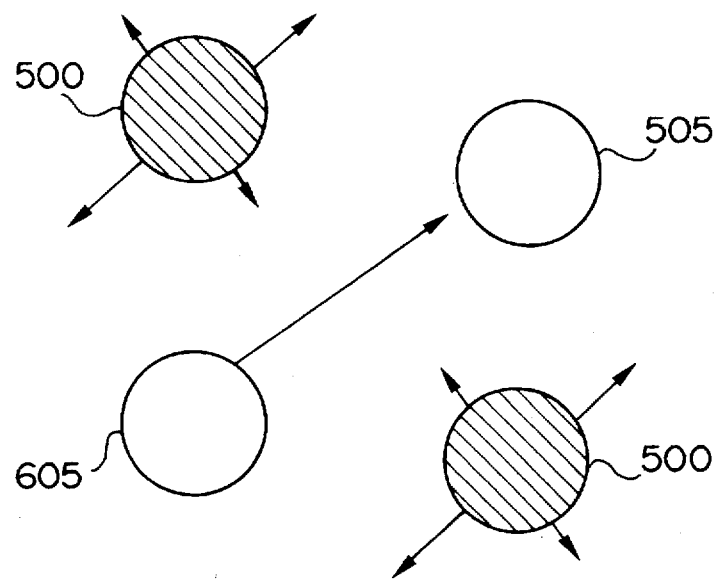
FIG. 37 is an explanatory view of use of the shielding effect formed according to the present invention.
Figure 38:
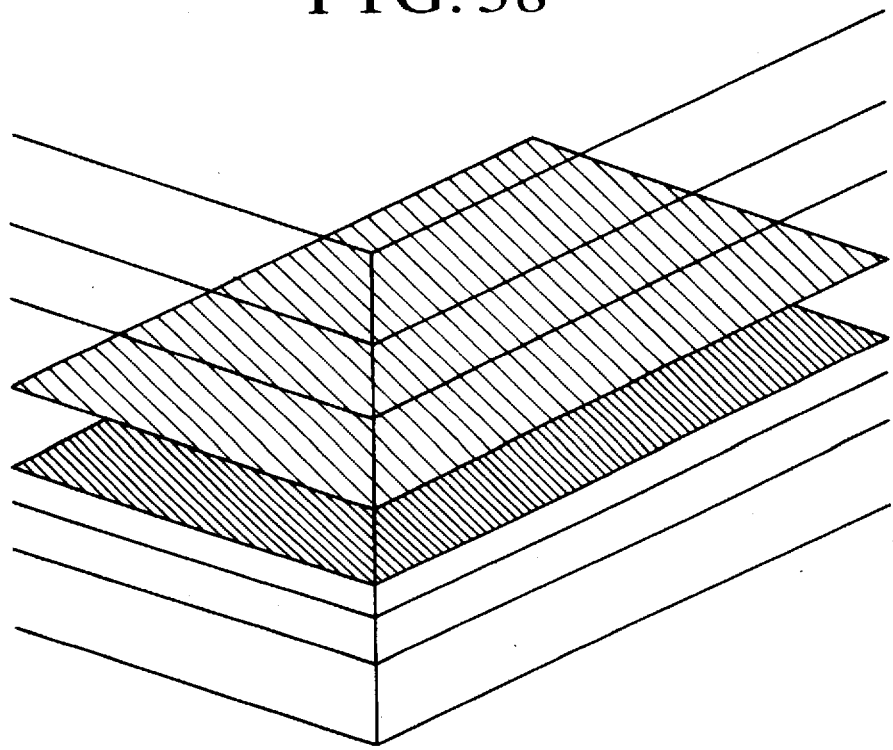
FIG. 38 shows an embodiment of the structure of a network formed according to the present invention.

Further, interference between respective layers may be created intentionally so that data can be exchanged between the respective layers. The ferro-electric substances may be replaced by semiconductors low in impurity concentration so that such a shielding effect can be brought by using hopping of electrons. As shown in FIG. 37, such a shielding effect can be brought by moving an atom to a position 500 constituting a body-center cubic lattice in the case of a T position or moving an electron only within the position 500 to give the effect of polarization or by vibrating an atom to increase the amplitude of the vibration only in a certain direction. By providing such an additional function, the frequency of movement of the electron between conducting materials and the time required for the movement can be adjusted. By setting the polarization to be created uniformly, the overall performance of the network can be changed or improved.

Further, by setting the polarization shown in FIG. 36 or 37 to be created in a considerably limited region, the frequency of movement of the electron between conducting materials in a certain portion and the time required for the movement can be adjusted. Accordingly, the performance of the network can be improved by changing the start, flight or arrival time of an electron with respect to conducting materials to adjust timing.

Figure 39:
FIG. 39 shows an embodiment of the structure of a spherical network formed according to the present invention.
Figure 40:
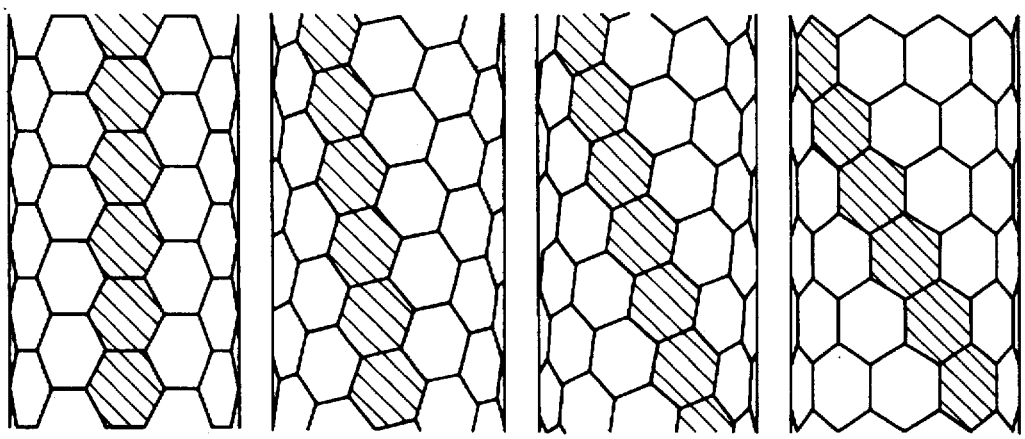
FIG. 40 shows an embodiment of the structure of a tube-like network formed according to the present invention.

The present invention is also effective to random lattices including not only hexagons but also trigons, tetragons, pentagons, heptagons, octagons, nonagons, etc., as shown in FIG. 35. Accordingly, conducting materials can be arranged cubically so that a circuit can be formed on a monolayer or multilayer spherical core as shown in FIG. 39 or on a tube or a circuit can be formed into a tube-like or helical cube as shown in FIGS. 41 and 42 or also formed into a sponge-like cube constituted by only negative curved surfaces as shown in FIG. 43. When conducting materials are arranged at vertices of each polygon, the aforementioned NOR or OR gate can be composed.

Figure 44:
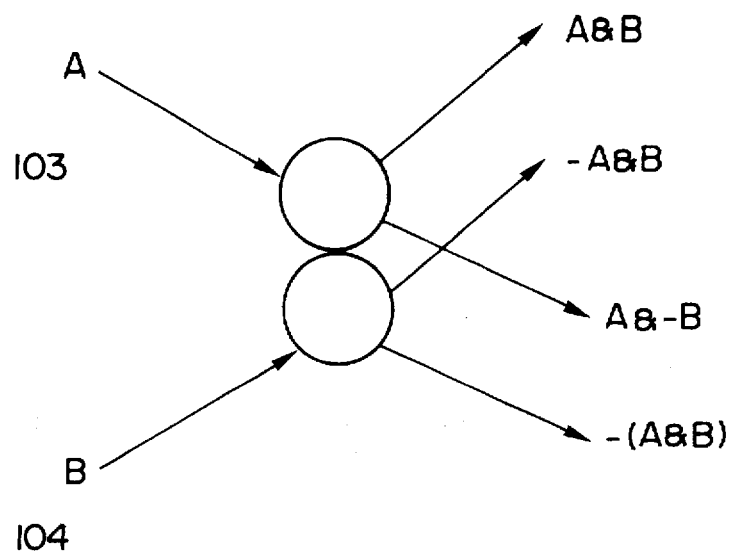
FIG. 44 shows billiard ball collision type logic constructed according to the present invention.
Figure 45:
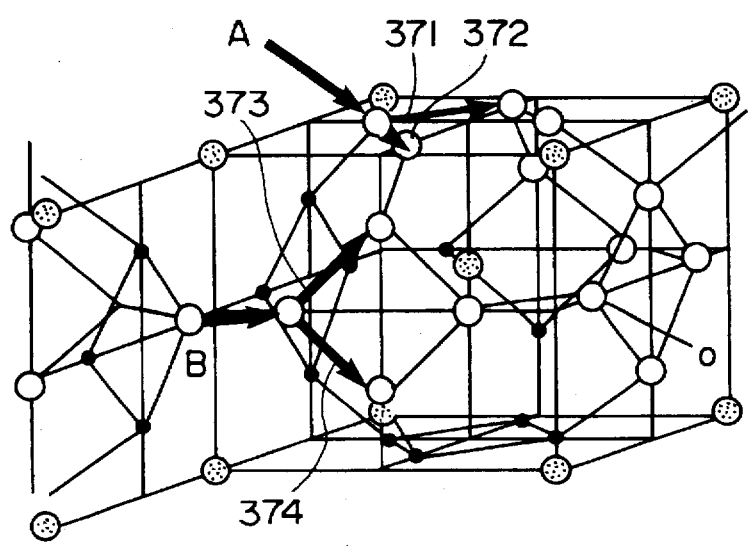
FIG. 45 shows an embodiment of a billiard ball network formed according to the present invention.

Although the above description has been made upon the classical operating theory, the present invention can be applied to a logic using collision of Brownian particles which movement can be defined only stochastically as shown in FIG. 44. In the logic, four outputs correspond to two inputs A and B. In the present invention, four outputs can be made to correspond to two inputs A and B by changing the way of the logic as shown in FIG. 45. Accordingly, the logic using collision of Brownian particles can be used in the wiringless logical network by three-dimensional quantum tunnelling. Also a network according to the quantum theory can be produced by highlighting the quantum-mechanical aspect of the three-dimensional electron tunneling effect. Whether such a particle is present in one position or not, can be determined stochastically in accordance with quantum mechanics.

This means that electrons not only have the property of particles, but also have the property of waves.

Now, an embodiment of the present invention, in which it is taken into account that an electron has the property of a wave, will be described.

For example, when the channel size of the metal-oxide-semiconductor (MOS) device is small, the particle and wave properties of electrons are obtained simultaneously, and rather the electron must be treated to have wave-particle duality, according to the laws of quantum mechanics.

Assuming for this purpose that the existence of an electron is expressed as a wavepacket, there occurs a case where the wavepacket is not all accommodated in a finite size site (or finite size lattice point) in which an electron is present as a particle. When such an electron is treated in quantum mechanics, it has been already known by the presentation by J. Summhammer, H. Rauch, and D. Tuppinger published article "Stochastic and deterministic absorption in neutron-interference experiments", *PHYSICAL REVIEW A*, Vol. 36, No. 9 (Nov. 1, 1987), pp. 4447–4455, that the wavepacket is chopped through a slit so that, for example, ⅓ or ¼ of an electron, i.e., a fragment of the electron, is detectable.

When the ⅓ or ¼ fragment of the electron is treated experimentally as a single electron, it may be considered that the movement of the electron is performed by "single electron tunneling", which is used in the present invention. The power consumption due to the movement of the electron is also reduced to the order of ⅓ or ¼.

There may occur a case where part of the wavepacket is deformed due to noise, and a case where the overall wavepacket sometimes disappears. In the former case, an effective portion among the wavepacket, such as its central portion which is difficult to influence by noise, is extracted by chopping. In the case of the individual wavepackets that are superposed by the plural electrons, a part of the wavepacket can be extracted by the chopping technique mentioned above.

The electron fragment extracted by chopping the remaining superimposed wavepackets is considered as "a single electron", so that it can be regarded as one particle which moves by "single electron tunneling". Accordingly, the particle fragment is taken as an input p, q of the OR gate in FIG. 1, for example, to execute an OR logic operation. In this case, the power consumption for the movement increases depending upon the number of wavepackets to be superposed, but the signal-to-noise ratio is improved.

Figure 46:
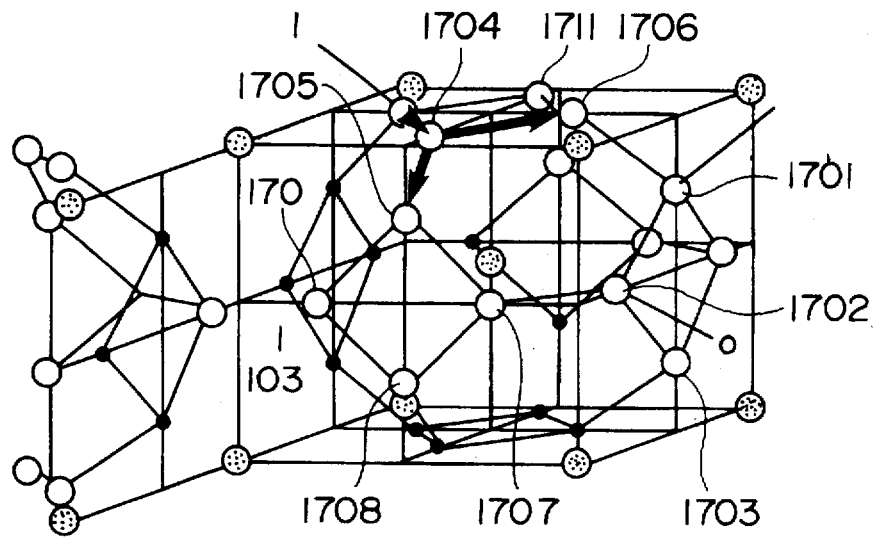
FIG. 46 is an explanatory view of the state of interaction in a network formed according to the present invention.
Figure 47:
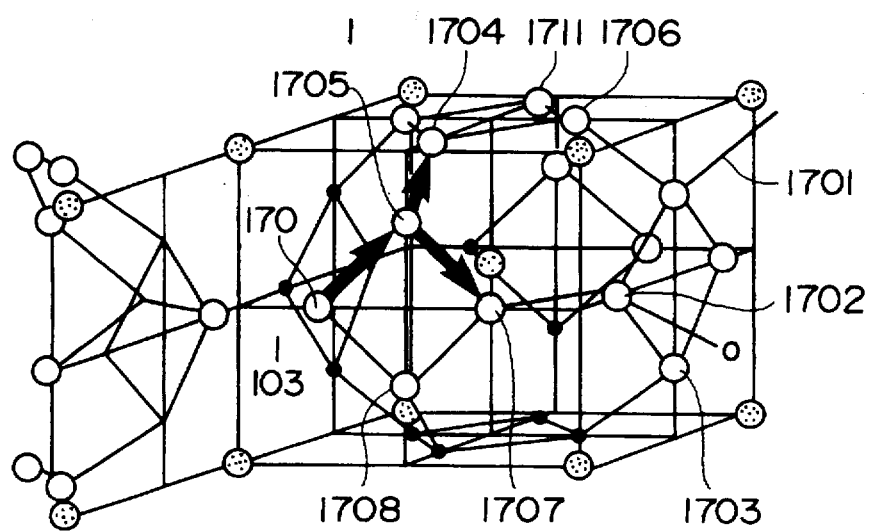
FIG. 47 is another explanatory view of the state of interaction in the network formed according to the present invention.
Figure 48:
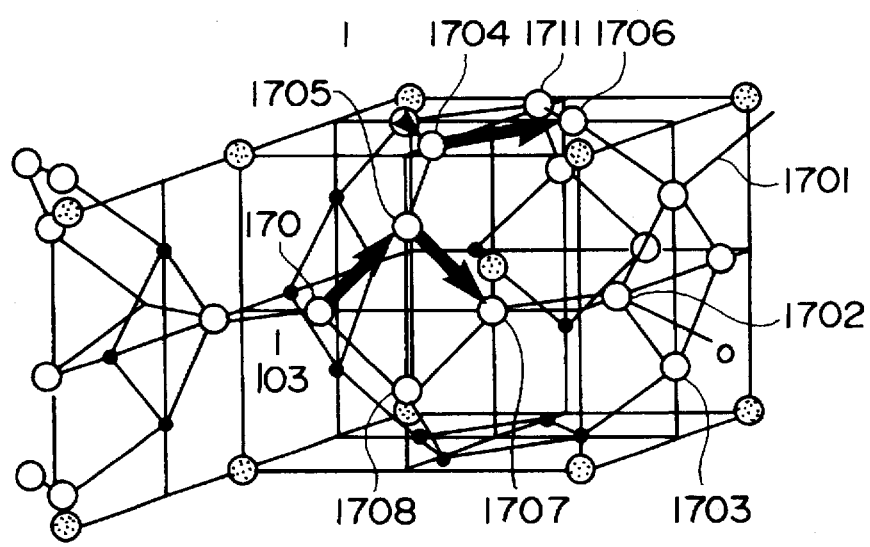
FIG. 48 is a further explanatory view of the state of interaction in the network formed according to the present invention.

The following are embodiments in which an electron is treated as a particle. Further, a circuit may be formed on the basis of the mechanism of interaction as shown in FIGS. 46, 47 and 48 corresponding to FIGS. 18, 19 and 20.

In the following, another embodiment in which conducting materials are arranged in a two-dimensional plane will be described.

Figures 53, 54:
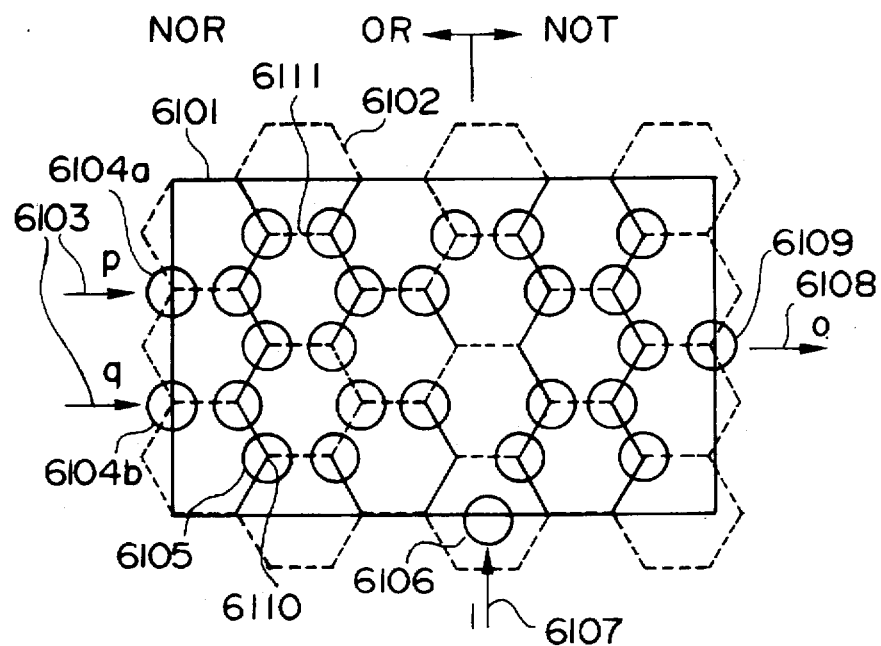
FIG. 53 shows an embodiment of a NOR gate formed according to the present invention.
FIG. 54 shows an embodiment of a logical operation by the NOR gate.

The logical circuit 6101 shown in FIG. 53 functions as a NOR gate. The structure of the logical circuit 6101 will be described below. In the logical circuit 6101, a two-dimensional plane of a substrate for arranging devices thereon is divided into a plurality of regular hexagons 6102 and cylindrical conducting materials 6105 are arranged at predetermined vertices 6110 of the respective regular hexagons so that the vertices 6110 are coincident with the respective centers of circles of the bottoms of the conducting materials 6105. The vertices 6110 of the arrangement of the conducting materials 6105 vary according to desired logic. When two conducting materials 6105 are arranged on the same side 6111 of one regular hexagon, the two adjacent conducting materials 6105 are connected to each other by the single-electron tunnel phenomenon through a small distance. In the case of another arrangement, there is no connection between conducting materials 6105 caused by the tunnel phenomenon. By the presence of the connection caused by the single-electron tunnel phenomenon, a signal or a single electron can propagate between the conducting materials 6105 without the necessity of wiring.

Further, the connection caused by the single-electron tunnel phenomenon is limited by the method of arrangement of conducting materials. Because the propagation path of a single electron can be controlled by changing the arrangement of conducting materials, the circuit 6101 can be formed as a circuit having various logical operation functions in accordance with the propagation path.

In the wiringless logical circuit according to the present invention, a small capacitor C is formed between two cylindrical conductive materials. When the radius of each cylinder, the height of the cylinder, the distance between side surfaces of two cylinders and the dielectric constant in the distance are expressed as a, l, d and $\epsilon_1$, respectively, the electrostatic capacitance c of the small capacitor having the facing side surfaces of the two cylinders as opposite surfaces is given by $c = \pi \epsilon_1 l \sqrt{(a/d)}$. If there is no material placed between two materials, $\epsilon_1$ is equal to the dielectric constant $\epsilon_0$ in a vacuum.

As the condition for connection between two conducting materials caused by the single-electron tunnel phenomenon, the length of one side 6111 of the aforementioned regular hexagon, the radius of each conducting material 6105 and the height of each cylinder are determined. When the radius a of each conducting material, the height l thereof and the distance d between the side surfaces of the cylinders are about 100 Å, about 100 Å and about 30 Å, respectively, the electrostatic capacitance c of the order of femto-Farad (fF) satisfying the condition for creating the aforementioned single-electron tunneling is obtained in the condition of an electric potential difference of about 0.1 V and a temperature of about 100K. In this case, the length D of one side of the regular hexagon becomes about 230 Å.

The plurality of conducting materials 6105 arranged in predetermined positions for constituting the logical circuit include conducting materials 6104 for performing inputting 6103 for a logical operation, conducting materials 6106 for inputting a predetermined signal, that is, a constant 6107, and conducting materials 6109 for performing outputting of a result 6108 of the logical operation, as conducting materials having special functions. Other conducting materials 6105 are used for performing the logical operation in the process of transportation of one electron. In FIG. 53, two conducting materials 6104 are used for performing inputting for a logical operation and one conducting material 6109 is used for outputting a result of the logical operation. That is, the logical circuit 6101 is considered as a two-input one-output logical operation gate. Generally, the logical circuit 6101 is a multi-input one-output circuit. The input of a constant 6107 is a steady-state signal which is provided additionally in accordance with the desired logical operation.

In the present invention, the single-electron excess state in which one electron is placed in a conducting material is logically expressed as "1" whereas the normal state in which no electron is placed in the conducting material is logically expressed as "0". Further, when another electron tries to enter into a conducting material of the single-electron excess state through another path or when two electrons try to enter into one and the same conducting material through different paths respectively, the energy of the conducting material is increased by coulomb interaction between the two electrons. Accordingly, the electron trying to enter into the conducting material later or the two electrons trying to enter into the conducting material simultaneously cannot enter into the conducting material and the propagation path thereof is changed. After going through several series of aforementioned procedures, an arithmetic operation is carried out according to the arrangement of the plurality of cylinders and a result thereof is outputted.

That is, the state in which an electron is introduced into a predetermined signal input conducting material 6104 at a certain time interval by applying negative electric potential to the conducting material 6104 is expressed as a state "1". The time interval for introduction of the electron is determined by the magnitude of the applied electric potential. Whether the electron introduced into the wiringless logical circuit can propagate between the plurality of conducting materials 6105 and finally can reach the signal output conducting material 6108 or not, corresponds to a result "1" or "0" of the logical operation. FIG. 54 shows output results 6108 in accordance with predetermined input conditions 6103 given to the logical circuit 6101 shown in FIG. 53. The NOR gate logical circuit shown in FIG. 53 is composed of an OR gate logical circuit and an NOT gate logical circuit. An output 6108 obtained according to the truth value table shown in FIG. 54 in response to two input signals p and q (6103) is outputted from the conducting material 6109. In the following, the internal structures and operations of individual logical operation devices will be described.

Figure 66:
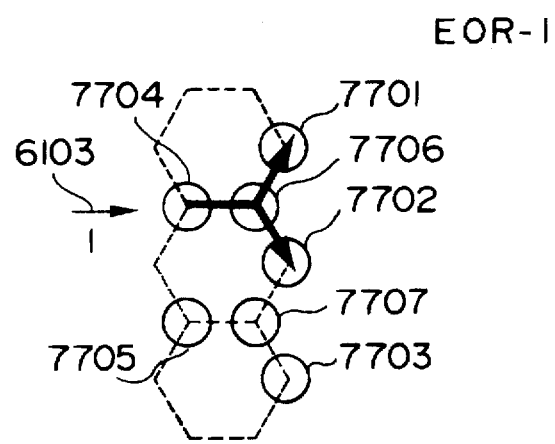
FIG. 66 is an explanatory view of signal propagation in the EOR gate formed according to the present invention.
Figure 67:
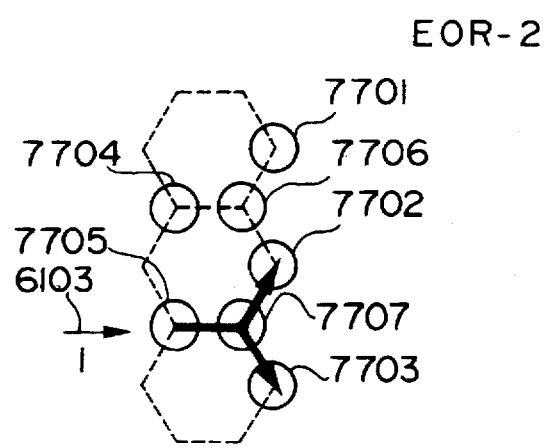
FIG. 67 is another explanatory view of signal propagation in the EOR gate formed according to the present invention.
Figure 68:
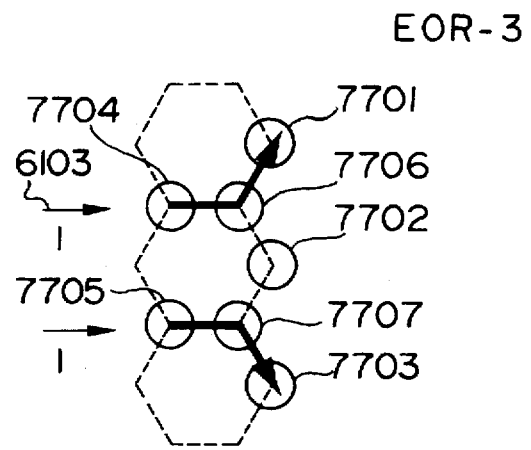
FIG. 68 is a further explanatory view of signal propagation in the EOR gate formed according to the present invention.

Referring to FIGS. 66, 67 and 68, the state in which one electron propagates between conducting materials arranged two-dimensionally will be described now. The arrangement of conducting materials shown in FIGS. 66, 67 and 68 is one fundamental arrangement of conducting materials in the present invention. Assume now the case where negative electric potential 6103 is applied to a conducting material 7704 as shown in FIG. 66 so that the conducting material 7704 is in a high energy state with respect to the electron having negative electric charge. Incidentally, conducting materials 7701, 7702 and 7703 are connected to electric potential 0. This corresponds to the fact that a signal 1 is inputted into the conducting material 7704. In this case, electrons pass through the conducting material 7706 one by one and flow into either of the conducting materials 7701 and 7702 in the probability of ½.

Further, because the energy of the conducting material 7707 is higher than the energy of the conducting material 7702, the flow of the electron into the conducting material 7703 is prohibited. Further, in the case where there is no conducting material on the same side of the hexagon, tunneling of the electron is prohibited. Accordingly, in the arrange of conducting materials shown in FIG. 66, when a signal "1" is inputted into the conducting material 7704 and a signal "0" is inputted into the conducting material 7705, a signal "1" is outputted to the conducting materials 7701 and 7702, so that a signal "0" is outputted to the conducting material 7703.

FIG. 67 shows the state of propagation of electrons in the case where signals "0" and "1" are inputted into the conducting materials 7704 and 7705, respectively, in the condition in which conducting materials are arranged in the same manner as in FIG. 66. Considering this case in the same manner as in FIG. 66, a signal "1" is outputted to the conducting materials 7702 and 7703 whereas a signal "0" is outputted to the conducting material 7701.

Figure 65:
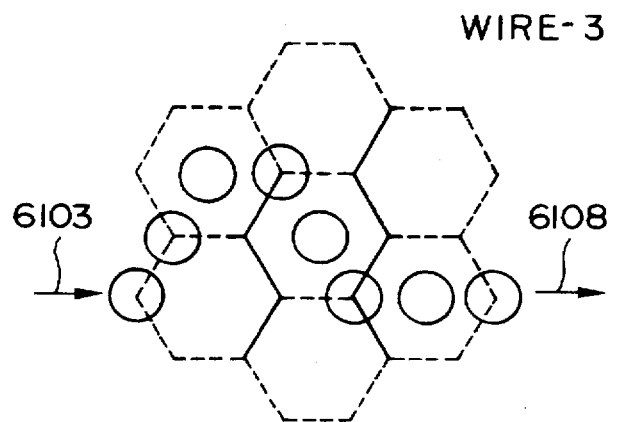
FIG. 65 shows a further embodiment of a wire formed according to the present invention.

FIG. 68 shows the state of propagation of electrons when a signal "1" is inputted to a conducting material 7704 and at the same time a signal "1" is inputted to a conducting material 7705 in the case where conducting materials are arranged in the same manner as in FIGS. 66 and 67. Although the behavior of one electron is considered in the cases of FIGS. 66 and 67, the behaviors of two electrons must be considered in this case because electrons flow from the two conducting materials 7704 and 7705. In this case, the flow of the electron into the conducting material 7702 is prohibited by coulomb interaction between two electrons as shown in FIG. 65. Accordingly, a signal "1" is outputted to the conducting materials 7701 and 7703, and a signal "0" is outputted to the conducting material 7702. If there is no input to the conducting materials 7704 and 7705, that is, if a signal "0" is inputted thereto, a signal "0" is outputted to the conducting material 7702.

Figures 59, 60:
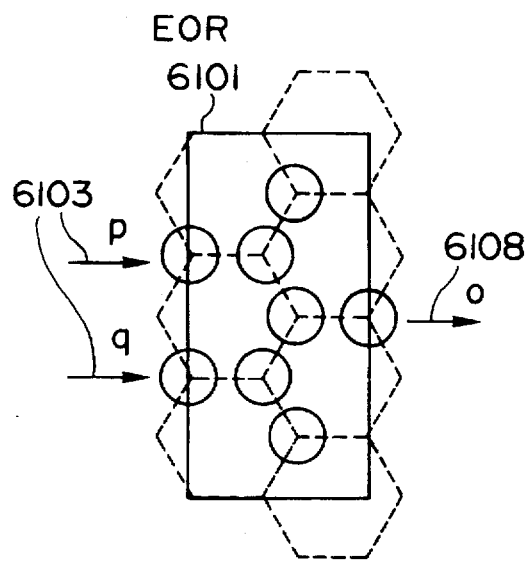
FIG. 59 shows an embodiment of an EOR gate formed according to the present invention.
FIG. 60 shows an embodiment of a logical operation by the EOR gate.

It is apparent from the above description that the arrangement of conducting materials shown in FIGS. 66, 67 and 68 forms a circuit for performing a logical operation of exclusive OR (EOR). FIG. 59 shows an embodiment of an EOR gate according to the present invention. The EOR gate shown in FIG. 55 outputs one result 6108 of an arithmetic operation in response to two inputs p and q 6103. FIG. 60 shows a truth value table for a logical operation of the EOR gate. An OR gate, a NOT gate, a FANOUT and further, a wire can be formed based on the fundamental arrangement shown here. Any logical circuit can be composed theoretically so long as the OR gate, the NOT gate, the FANOUT and the wire can be formed.

Figures 55, 56:
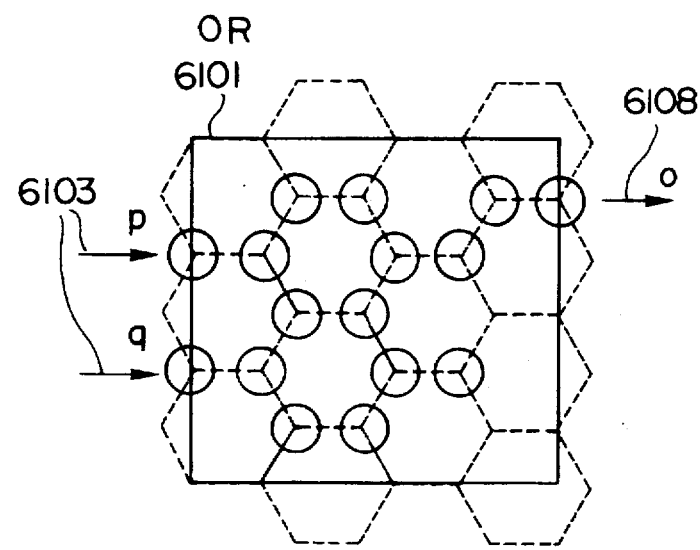
FIG. 55 shows an embodiment of an OR gate formed according to the present invention.
FIG. 56 shows an embodiment of a logical operation by the OR gate.

FIG. 55 shows an embodiment of an OR gate according to the present invention. FIG. 56 shows a truth value table for the logical operation of the OR gate. The OR gate shown in FIG. 55 outputs one result 6108 of an arithmetic operation in response to two inputs p and q 6103. The reason why the arrangement of conducting materials shown in FIG. 55 gives the arithmetic operation shown in FIG. 56 will be described with reference to FIGS. 69, 70 and 71.

Figure 69:
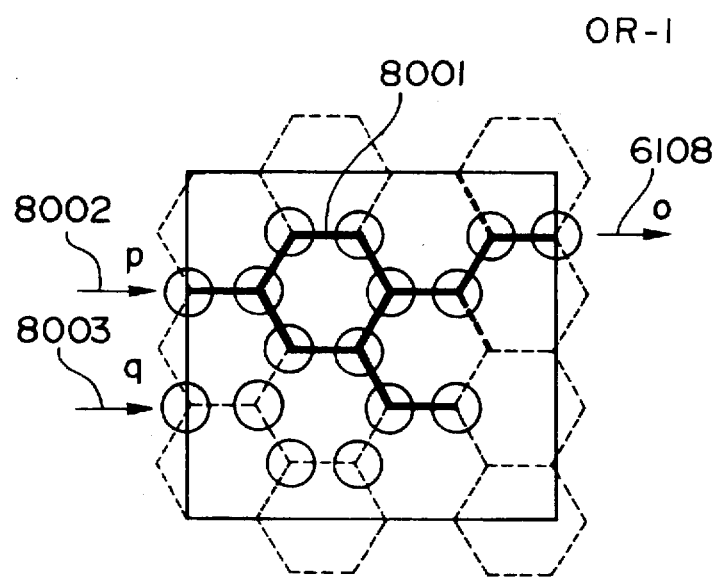
FIG. 69 is an explanatory view of signal propagation in the OR gate formed according to the present invention.
Figure 70:
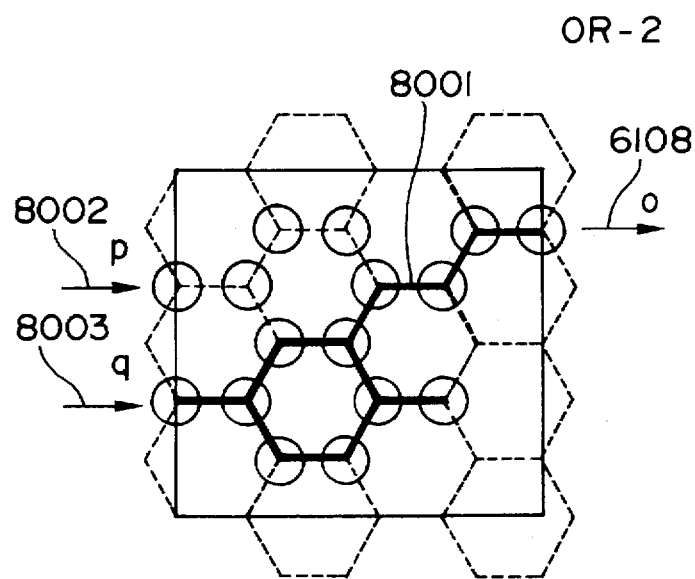
FIG. 70 is another explanatory view of signal propagation in the OR gate formed according to the present invention.

As shown in FIG. 69, when an input signal p 8002 is "1" and the other input signal q 8003 is "0", electrons propagate along the propagation path 8001 indicated by the thick solid line. Accordingly, the output signal 6108 is "1". As shown in FIG. 70, when one input signal p 8002 is "0" and the other input signal q 8003 is "1", electrons propagate along the propagation path 8001 indicated by the thick solid line. Accordingly, the output signal 6108 is "1".

Figure 71:
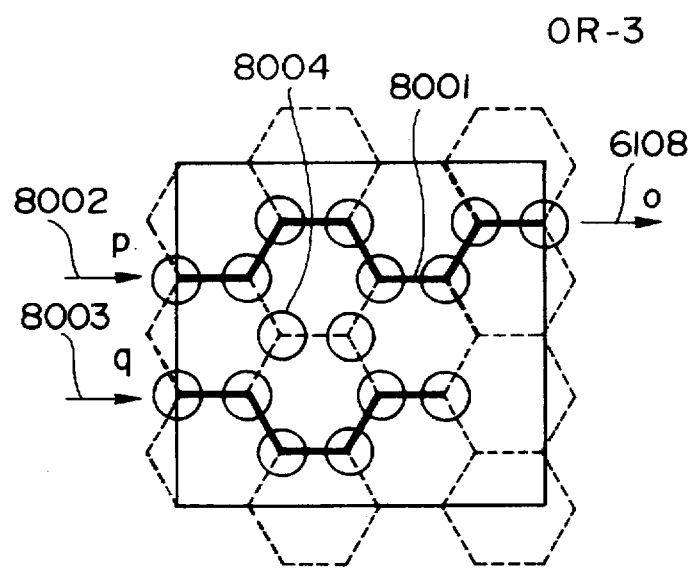
FIG. 71 is an explanatory view of signal propagation in the OR gate formed according to the present invention.

As shown in FIG. 71, when one input signal p 8002 is "1" and the other input signal q 8003 is "1", electrons propagate along the propagation path 8001 indicated by the thick solid line because the propagation of electrons into the conducting material 8004 is prohibited by coulomb interaction between two electrons. Accordingly, the output signal 6108 is "1". Contrariwise, when one input signal p 8002 is "0" and the other input signal q 8003 is "0", propagation of electrons does not occur. Accordingly, the output signal 6108 is "0".

It is apparent from the above description that the arrangement shown in FIG. 55 serves as an OR gate.

Figures 57, 58:
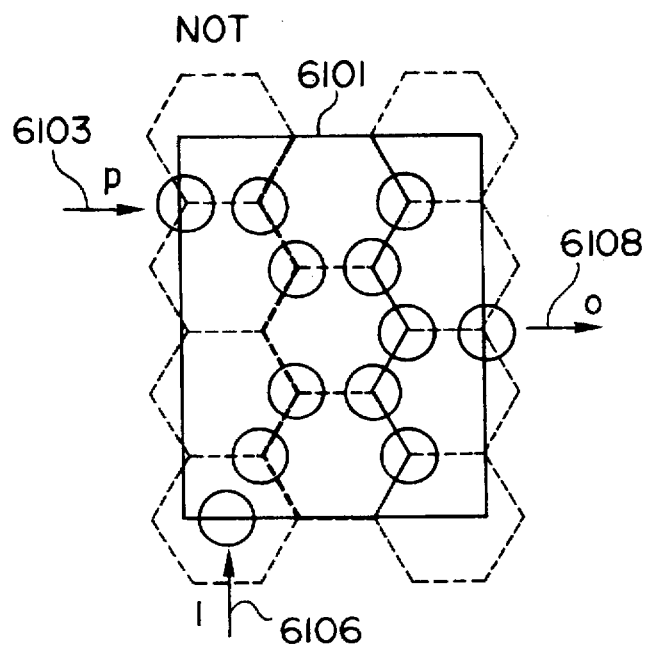
FIG. 57 shows an embodiment of a NOT gate formed according to the present invention.
FIG. 58 shows an embodiment of a logical operation by the NOT gate.
Figure 72:
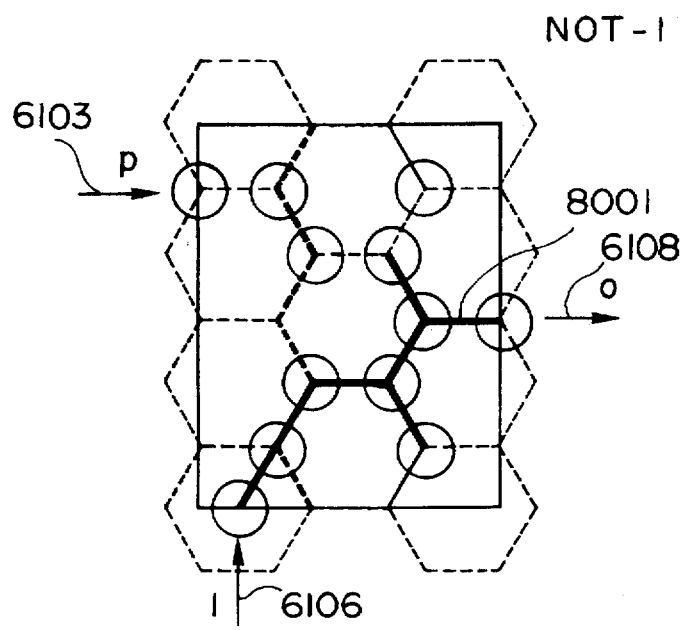
FIG. 72 is an explanatory view of signal propagation in the NOT gate formed according to the present invention.
Figure 73:
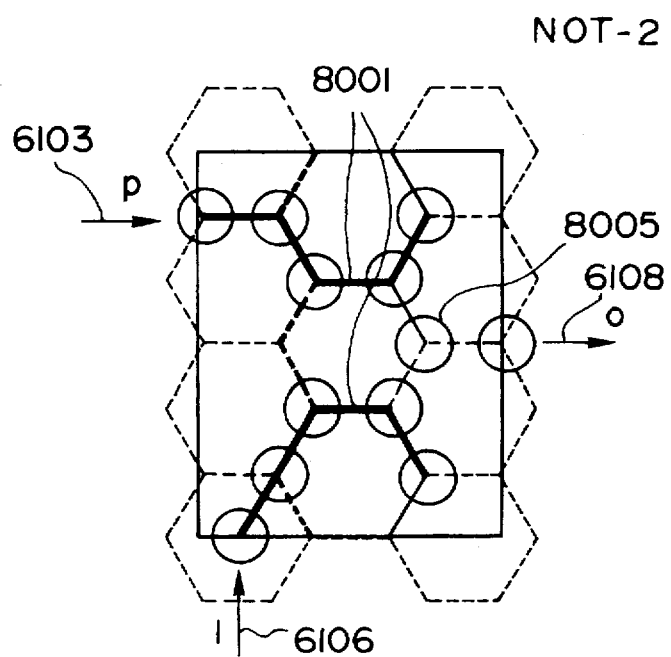
FIG. 73 is another explanatory view of signal propagation in the NOT gate formed according to the present invention.

FIG. 57 shows an embodiment of a NOT gate according to the present invention. FIG. 58 shows a truth value table for the logical operation of the NOT gate. The NOT gate shown in FIG. 57 outputs one result 6108 of an arithmetic operation in response to one input p 6103. The NOT gate is however different from the OR gate in that a signal having a constant value "1" is given as a constant input 6106 in the NOT gate. The reason why the arrangement of conducting materials shown in FIG. 57 gives an arithmetic operation shown in FIG. 58 will be described below with reference to FIGS. 72 and 73. As shown in FIG. 72, when the input signal p 6103 is "0", the constant input 6106 is used singly so that electrons propagate along the propagation path 8001 indicated by the thick solid line. Accordingly, the output signal 6108 is "1". As shown in FIG. 73, when the input signal p 6103 is "1", electrons propagate along the propagation path 8001 indicated by the thick solid line because the propagation of electrons into the conducting material 8005 is prohibited by coulomb interaction between two electrons. Accordingly, the output signal 6108 is "0". It is apparent from the above description that the arrangement shown in FIG. 57 serves as a NOT gate.

The fact that the logical circuit shown in FIG. 53 serves as a logical operation circuit shown in FIG. 54, that is, as a NOR gate, can be understood from the fact that the circuit is composed of an OR gate as shown in FIGS. 69 to 71 and an NOT gate as shown in FIGS. 72 and 73. An AND gate and a NAND gate which are logical operation devices of a logical circuit can be provided by combining the aforementioned OR and the NOT gates. That is, the AND gate is formed by $A \cap B = \overline{(\overline{A} \cup \overline{B})}$. ($\overline{A}$ expresses negation NOT of A.) The NAND gate is formed by $\overline{(A \cap B)} = (\overline{A} \cup \overline{B})$.

Figures 61, 62:
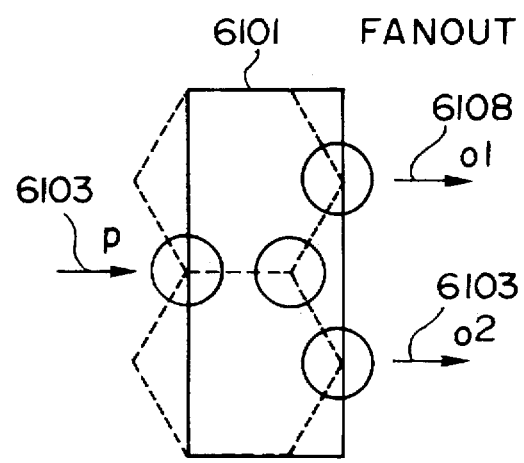
FIG. 61 shows an embodiment of a FANOUT formed according to the present invention.
FIG. 62 shows an embodiment of a logical operation by the FANOUT.

FIG. 61 shows an embodiment of a FANOUT according to the present invention, the FANOUT receives one signal and outputs the signal as two signals without any change. FIG. 62 shows a truth value table for the logical operation of the FANOUT. When the input signal p 6103 is "1", an electron is detected as two output signals o1 and o2 6108 in the probability of ½. In this logical circuit shown in FIG. 61, an electron is introduced continuously for a predetermined time interval which is considerably longer than the time required for propagation of an electron from p to o1 and o2, so that both the output signals o1 and o2 take "1". When the input signal p 6103 is "0", both the output signals take o1 and o2 "0". It is apparent from the above description that the arrangement shown in FIG. 61 provides the function of the FANOUT.

Figure 63:
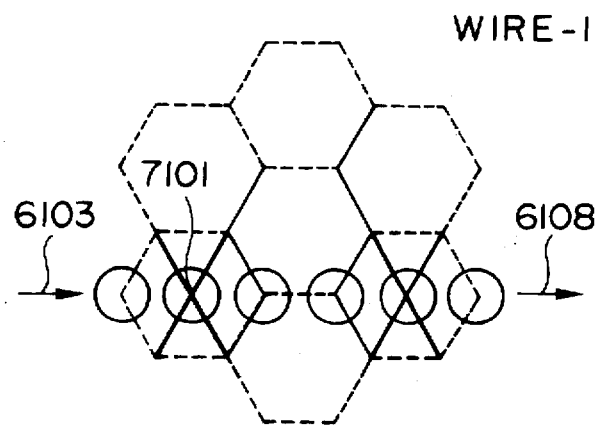
FIG. 63 shows an embodiment of a wire formed according to the present invention.
Figure 64:
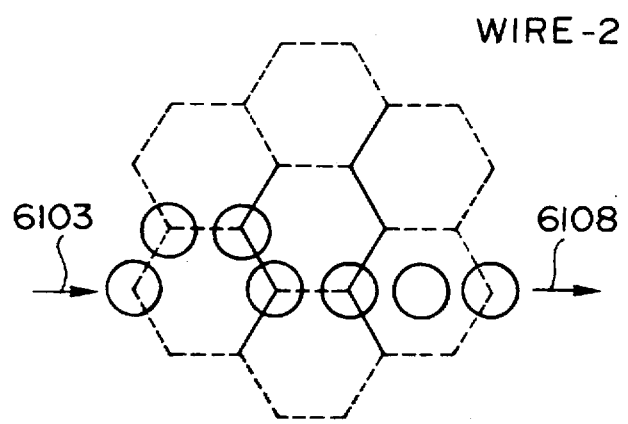
FIG. 64 shows another embodiment of wire formed according to the present invention.

In the following, an embodiment of a wire according to the present invention will be described with reference to FIGS. 63, 64 and 65. Wire has a function of adjusting the delay of propagation time of electrons. FIG. 63 shows a structure of a wire for transporting electrons without delay. Because the wire without delay is required to transport electrons linearly, this embodiment is different from the aforementioned embodiments in that a part of the conducting materials are arranged in the centers 7101 of gravity of regular hexagons. FIG. 64 shows a structure of a wire for transporting electrons with time delay 1. Here, "time delay 1" means that electrons must run longer by one-side's 'distance of the regular hexagon compared with the case of FIG. 63 when the distances of running of electrons are equal in the direction of application of voltage. FIG. 65 shows a structure of the wire for transporting electrons with time delay 3. From the above description, the signal delay can be provided by using various kinds of wire. Not only two inputs are required as the basic constituent unit of the logical circuit such as an OR gate or an EOR gate in the present invention but also it is necessary that the two signals are synchronized with each other in the timing of inputting of the two signals. In the case of a complex logical circuit, it is however considered that some difference is created between the lengths of propagation paths when the two signals pass through different propagation paths respectively. In this case, the two signals can be synchronized by using the wire shown in FIGS. 64 and 65.

As shown in FIG. 74, a multilayer logical circuit can be formed by: elongating the length of a part of cylindrical conducting materials upward from the substrate; providing through-holes in the conducting materials; and providing, between upper and lower layers, insulating layers sufficiently thicker than the distance d so that interference between layers through single-electron tunneling can be avoided. The conducting material 8801 shown in FIG. 74 has a through-hole connecting the second and third layers, and the conducting material 8802 has a through-hole connecting the first and third layers. A signal propagates between layers through the path 8803. The respective layers are insulated by sufficiently thick insulating layers 8804 and 8805. The multilayer logical circuit as shown in FIG. 74 is achieved by repeating a producing process of forming a one-layer circuit and covering the whole circuit with a sufficiently thick insulating layer while changing the positions of quantum dots.

In the aforementioned OR gate, the EOR gate, and so on, the number of passes is determined in accordance with the internal structure thereof. The number of passes is equal to the number of distances between conducting materials through which a signal passes in a period of from the point of time when a signal is inputted into one gate to the point of time when a signal is outputted from the gate, that is, the number of times of single-electron tunneling. The number of passes in the OR gate shown in FIG. 55, the number of passes in the NOT gate shown in FIG. 57 and the number of passes in the EOR gate shown in FIG. 59 are 7, 5 and 3, respectively. By accumulating the number of passes in accordance with various gates in the way of signal propagation, the time delay of the wire shown in FIGS. 64 and 65 is determined, so that two signals inputted into the gate can be synchronized with each other by inserting a necessary wire on the basis of the determination of the time delay.

Further, U.S. patent application Ser. No. 08/117801, filed Oct. 15, 1992, now U.S. Pat No. 5,422,496, discloses a single electron tunnel device using inter-band tunneling in a conventional PN junction transistor. It is possible to constitute the logical operation circuit of the present invention by using the above-mentioned device.

We claim:

1. A wiringless logical operation circuit for performing a logical operation in response to a predetermined input, said circuit having polygonal conducting materials arranged in the vicinity of respective lattice points obtained by dividing an N-dimensional region, N being an integer of at least 2 and no greater than 3, of said circuit by a grating so that single-electron tunneling occurs between nearest conducting materials, wherein a logical operation is carried out under conditions that a site having a state of an excess m of electrons, m being a positive real number, in a conducting material is made to correspond to logic "1", and an excess-electron vacancy state is made to correspond to logic "0", and that the case where an electron introduced into a predetermined conducting material for signal inputting can reach a conducting material for signal outputting is made to correspond to a result of "1" of the logical operation but the case where the electron cannot reach the signal output conducting material is made to correspond to a result of "0" of the logical operation.

2. A wiringless logical operation circuit for performing a logical operation in response to a predetermined input, said circuit having polygonal conducting materials arranged in an N-dimensional region, N being an integer of at least 2 and no greater than 3, of said circuit so that two conducting materials within an effective scatter distance are connected by a single-electron tunnel phenomenon but two conducting materials out of the effective scatter distance are not connected by the single-electron tunneling phenomenon, wherein a logical operation is carried out under conditions that a site having a state of an excess m of electrons, m being a positive real number, in a conducting material is made to correspond to logic "1", and an excess-electron vacancy state is made to correspond to logic "0", and that the case where an electron introduced into a predetermined conducting material for signal inputting can reach a conducting material for signal outputting is made to correspond to a result "1" of the logical operation but the case where the electron cannot reach the signal output conducting material is made to correspond to a result "0" of the logical operation.

3. A wiringless logical operation circuit for performing a logical operation in response to a predetermined input, said circuit having polygonal conducting materials arranged in an N-dimensional region, N being an integer of at least 2 and no greater than 3, of said circuit so that two or more electrons do not enter into an effective scatter distance so that two conducting materials within the effective scatter distance are connected by a single-electron tunnel phenomenon but two conducting materials out of the effective scatter distance are not connected by the single-electron tunneling phenomenon, and two or more electrons do not enter into said distance, wherein a logical operation is carried out under conditions that a site having a state of an excess m of electrons, m being a positive real number, in a conducting material is made to correspond to logic "1", and an excess-electron vacancy state is made to correspond to logic "0", and that the case where an electron introduced into a predetermined conducting material for signal inputting can reach a conducting material for signal outputting is made to correspond to a result "1" of the logical operation. but the case where the electron cannot reach the signal output conducting material is made to correspond to a result "0" of the logical operation.

4. A wiringless logical operation circuit according to claim 1, wherein said conducting materials are arranged so that two or more electrons are not present within an effective scatter distance.

5. A wiringless logical operation circuit for performing a logical operation in response to a predetermined input, said circuit having polygonal conducting materials arranged at respective lattice points obtained by dividing an N-dimensional region, N being an integer of at least 2 and no greater than 3, of said circuit to make distances between the lattice points equal to each other so that single-electron tunneling is created between nearest conducting materials, wherein a logical operation is carried out under conditions that a site having a state of an excess m of electrons, m being a positive real number, in a conducting material is made to correspond to logic "1", and an excess-electron vacancy state is made to correspond to logic "0", and that the case where an electron introduced into a predetermined conducting material for signal inputing can reach a conducting material for signal outputting is made to correspond to a result "1" of the logical operation but the case where the electron cannot reach the signal output conducting material is made to correspond to a result "0" of the logical operation.

6. A wiringless logical operation circuit for performing a logical operation in response to predetermined input, said circuit having polygonal conducting materials arranged at respective lattice points obtained by dividing an N-dimensional region, N being an integer of at least 2 and no greater than 3, of said circuit by normal lattice points so that single-electron tunneling is created between nearest conducting materials, wherein a logical operation is carried out under conditions that a site having a state of excess m of electrons, m being a positive real number, in a conducting material is made to correspond to logic "1", and an excess-electron vacancy state is made to correspond to logic "0", and that the case where an electron introduced into a predetermined conducting material for signal inputting can reach a conducting material for signal outputting is made to correspond to a result "1" of the logical operation but the case where the electron cannot reach the signal output conducting material is made to correspond to a result "0" of the logical operation.

7. A wiringless logical operation circuit according to claim 1, wherein conducting materials which are arranged so that the centers of said conducting materials are coincident with said vertices, have sizes such that conducting material arranged nearest to each other are connected by a tunnel phenomenon but a connection between conducting materials caused by the tunnel phenomenon is avoided in a case of conducting materials which are not nearest to each other.

8. A wiringless logical operation circuit according to claim 1, wherein a logical operation is carried out under the operating condition that two or more electrons inputted into the signal-input conducting materials cannot enter one and the same conducting material.

9. A wiringless logical operation circuit according to claim 8, wherein movement of one of an atom and an electron only within a conducting material is created under an operating condition to give an effect of at least one of polarization and increased amplitude of vibration of atoms to increase the amplitude of the vibration only in a certain direction, so that the movement of an electron created in one position makes movement of electrons in other positions hard or, to the contrary, easy, which changes one of the start time, flight time and arrival time of the electron in the conducting material and adjusts timing for controlling the logical operation at least partly.

10. A wiringless logical operation circuit according to claim 8, wherein a logical network is put between dielectric substances in the form of a sandwich so that a logical operation is carried out under said operating condition while interference between respective layers is screened.

11. A wiringless logical operation circuit according to claim 1, wherein when a network is formed in said N-dimensional region, said polygonal conducting material has polygons selected from the group consisting of hexagons, trigons, tetragons, pentagons, heptagons, octagons and nonagons.

12. A wiringless logical operation circuit comprising logical circuits each constituted by a plurality of logical operation devices each formed by arranging cylindrical conducting materials in positions of respective vertices preliminarily determined in accordance with the type of logical operation among a plurality of vertices of regular hexagons obtained by dividing a substrate so that a respective vertex is made consistent with a center of cylindrical cross-sections of the cylindrical conducting materials in a bottom of each of the cylindrical conducting materials and by arranging said cylindrical conducting materials at intervals of a distance allowing an electron to propagate between the cylindrical conducting materials by single-electron tunneling through side surfaces of the cylindrical conducting materials, said logical operation devices being connected through the single-electron tunnel between two conducting materials adjacent to each other at the distance.

13. A wiringless logical operation circuit according to claim 12, wherein: said logical operation devices constituting said logical circuit are designed so that a state in which a site having an excess m of electrons, m being a positive real number, existing in each of said cylindrical conducting materials, is made to correspond to logical truth, and a state in which a single electron is absent is made to correspond to logical false; injection of two electrons into a first cylinder simultaneously from second and third cylinders each of which is adjacent to the first cylinder at the distance and each of which is in the state of truth is prohibited by coulomb interaction between the two electrons; and said conducting materials have such cylinder size that electrons propagate in other paths from the second and third cylinders.

14. A wiringless logical operation circuit according to claim 13, wherein: a plurality of layers each constituted by said logical circuit are laminated through insulating layers having a predetermined thickness; and some of said cylindrical conducting materials are so separated that two layers different from each other form opposite ends thereof.

15. A wiringless logical operation circuit according to claim 2, further having electric field generating means for applying an electric field to the N-dimensional region in which said conducting materials are arranged, for the purpose of generating single-electron tunneling of electrons which are present in said conducting materials.

16. A wiringless logical operation circuit having a plurality of conducting materials arranged in a space within said circuit, wherein said conducting materials are connected by single-electron tunneling when the distance between said conducting materials is within an effective scatter distance.

17. A wiringless logical operation circuit having a plurality of conducting materials arranged in a space within said circuit, wherein said conducting materials are connected electrically only when the distance between said conducting materials is within an effective scatter distance.

18. A wiringless logical operation circuit comprising:
a substrate formed of an insulator;
conducting regions constituted by conducting materials and arranged discretely in said substrate;
means for injecting electrons into respective conducting regions of a first conducting region group which includes at least one conducting region;
means for extracting electrons from respective conducting regions of a second conducting region group which includes at least one conducting region; and
means for applying an electric field to said substrate so that electrons injected by said electron injection means are transmitted to said electron extraction means via said plurality of conducting regions by single-electron tunneling, wherein
the respective distances between said conducting materials are fixed so that an output pattern indicating whether any electron is extracted from the respective conducting regions of said second group or not, is determined uniquely on the basis of an input pattern indicating whether electrons are injected into the respective conducting regions of the first group or not.

19. A wiringless logical operation circuit for performing a logical operation in response to a predetermined input, said circuit having polygonal conducting materials which are arranged in an N-dimensional region, N being an integer of at least 2 and no greater than 3, of said circuit so that two conducting materials located within an effective scatter distance are connected by repulsion between particles but two conducting materials located out of said distance are not connected by said repulsion, wherein a logical operation is carried out under conditions that the case where a particle introduced into a predetermined signal-input conducting material can reach a signal-output conducting material is made to correspond to a result "1" of the logical operation and the case where the particle cannot reach the signal-output conducting material is made to correspond to a result "0" of the logical operation.

20. A wiringless logical operation according to claim 1, wherein said N-dimensional region is divided by lattice points such that distances between said lattice points are made equal to each other.

21. A wiringless logical operation circuit according to claim 1, wherein said N-dimensional region is divided by normal lattice points.

* * * * *